(12) United States Patent
Hwang et al.

(10) Patent No.: US 11,889,688 B2
(45) Date of Patent: Jan. 30, 2024

(54) SEMICONDUCTOR DEVICE WITH KEY PATTERN AND ELECTRONIC SYSTEM INCLUDING SAME

(71) Applicant: SAMSUNG ELECTRONICS CO., LTD., Suwon-si (KR)

(72) Inventors: Chang-Sun Hwang, Hwaseong-si (KR); Gihwan Kim, Suwon-si (KR); Chungki Min, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/509,567

(22) Filed: Oct. 25, 2021

(65) Prior Publication Data

US 2022/0181345 A1 Jun. 9, 2022

(30) Foreign Application Priority Data

Dec. 3, 2020 (KR) ............... 10-2020-0167275

(51) Int. Cl.
| | |
|---|---|
| *H01L 27/11556* | (2017.01) |
| *H10B 41/27* | (2023.01) |
| *H01L 29/66* | (2006.01) |
| *G11C 5/02* | (2006.01) |
| *H01L 25/07* | (2006.01) |
| *G11C 5/06* | (2006.01) |
| *H10B 43/27* | (2023.01) |

(52) U.S. Cl.
CPC ............ *H10B 41/27* (2023.02); *G11C 5/025* (2013.01); *G11C 5/06* (2013.01); *H01L 25/074* (2013.01); *H01L 29/66666* (2013.01); *H10B 43/27* (2023.02)

(58) Field of Classification Search
CPC ........ H10B 41/27; H10B 43/27; G11C 5/025; G11C 5/06
See application file for complete search history.

(56) References Cited

U.S. PATENT DOCUMENTS

| | | |
|---|---|---|
| 7,119,013 B2 | 10/2006 | Lee et al. |
| 7,316,963 B2 | 1/2008 | Lee |
| 7,575,997 B2 | 8/2009 | Lee |
| 7,879,729 B2 | 2/2011 | Jung |
| 9,716,137 B1 | 7/2017 | Hu et al. |
| 10,008,389 B2 | 6/2018 | Kang et al. |
| 10,318,170 B2 | 6/2019 | Zhao et al. |
| 10,515,981 B2 | 12/2019 | Or-Bach et al. |

(Continued)

FOREIGN PATENT DOCUMENTS

| | | |
|---|---|---|
| KR | 10-2006-0077945 A | 7/2006 |
| KR | 1020220013800 A | 2/2022 |

*Primary Examiner* — Walter H Swanson
(74) *Attorney, Agent, or Firm* — Fish & Richardson P.C.

(57) ABSTRACT

A semiconductor device include; a substrate including a cell array region and a key region, a stack structure on the cell array region including vertically stacked electrodes, a dummy structure on the key region, a vertical channel structure penetrating the stack structure to connect the substrate, a dummy pillar penetrating the first dummy structure, an interlayer dielectric layer on the stack structure and the dummy structure, wherein an upper portion of the interlayer dielectric layer on the dummy structure includes a key pattern that vertically overlaps the dummy pillar, and a capping layer on the key region and covering the key pattern.

20 Claims, 27 Drawing Sheets

(56) References Cited

U.S. PATENT DOCUMENTS

| | | | |
|---|---|---|---|
| 2018/0350830 A1* | 12/2018 | Lim | H10B 43/40 |
| 2019/0074282 A1* | 3/2019 | Shin | H10B 41/50 |
| 2021/0028058 A1* | 1/2021 | Kim | H01L 23/5226 |
| 2021/0375905 A1 | 12/2021 | Hiwang et al. | |

* cited by examiner

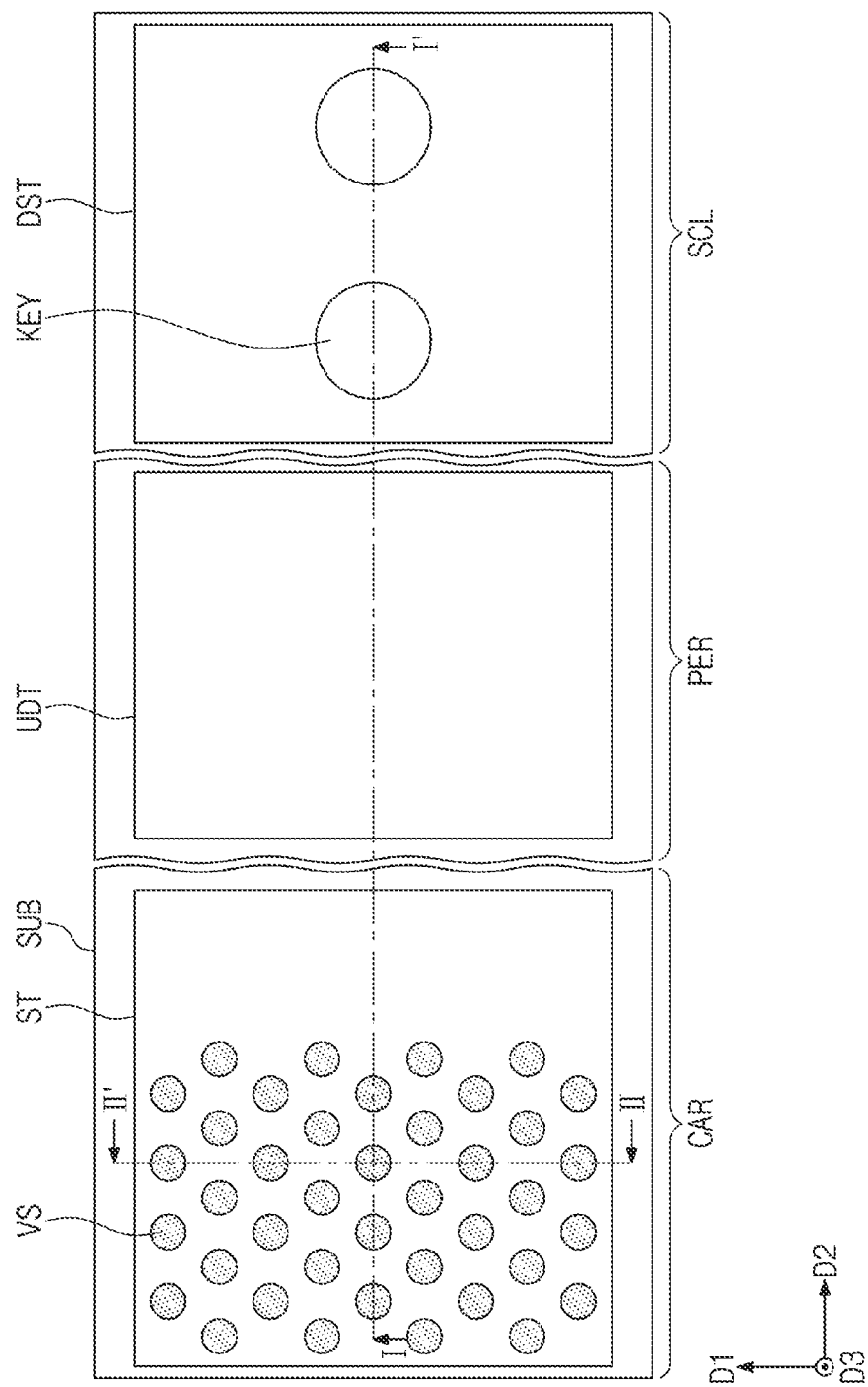

SEMICONDUCTOR DEVICE WITH KEY PATTERN AND ELECTRONIC SYSTEM INCLUDING SAME

CROSS-REFERENCE TO RELATED APPLICATION

This U.S. nonprovisional application claims priority under 35 U.S.C § 119 to Korean Patent Application No. 10-2020-0167275 filed on Dec. 3, 2020 in the Korean Intellectual Property Office, the subject matter of which is hereby incorporated by reference.

BACKGROUND

The inventive concept relates generally to three-dimensional semiconductor memory devices and an electronic system including same.

Contemporary and emerging electronic systems demand semiconductor memory devices capable of storing large amounts of data. Accordingly, various approaches to increasing data storage capacity and/or data storage density have been studied in relation to semiconductor memory devices. In one approach, data storage capacity of semiconductor memory devices has been increased by use of three-dimensional arrangements of memory cells, instead of using two-dimensional arrangements of memory cells.

SUMMARY

Embodiments of the inventive concept provide three-dimensional semiconductor memory devices exhibiting improved reliability. Embodiments of the inventive concept also provide methods of fabricating such three-dimensional semiconductor memory devices.

According to some embodiments of the inventive concept, a semiconductor device may include a substrate including a cell array region and a key region, a stack structure on the cell array region, wherein the stack structure includes a first stack structure on the substrate and a second stack structure on the first stack structure, each of the first and second stack structures including a vertically stacked and spaced apart electrodes, a dummy structure on the key region, wherein the dummy structure includes a first dummy structure on the substrate and a second dummy structure on the first dummy structure, a vertical channel structure penetrating the stack structure to connect the substrate, a dummy pillar penetrating the first dummy structure, an interlayer dielectric layer on the stack structure and the dummy structure, wherein an upper portion of the interlayer dielectric layer on the dummy structure includes a key pattern that vertically overlaps the dummy pillar, and a capping layer on the key region and covering the key pattern.

According to some embodiments of the inventive concept, an electronic system may include; a semiconductor device including an input/output pad electrically connected to a peripheral circuit, and a controller electrically connected through the input/output pad to the semiconductor device and configured to control the semiconductor device. The semiconductor device may include; a substrate including a cell array region and a key region, a stack structure on the cell array region, the stack structure including vertically stacked and spaced apart electrodes, a dummy structure on the key region, wherein an upper portion of the dummy structure includes a protrusion, a vertical channel structure penetrating the stack structure to connect the substrate, an interlayer dielectric layer on the stack structure and the dummy structure, wherein the interlayer dielectric layer on the upper portion of the dummy structure includes a key pattern, the key pattern vertically overlaps the protrusion of the dummy structure, a top surface of the interlayer dielectric layer on the dummy structure is higher than a top surface of the key pattern, and a capping layer on the key region and covering the key pattern, wherein the capping layer includes polysilicon.

According to some embodiments of the inventive concept, a method of fabricating a semiconductor device may include; forming a first mold structure and a first dummy structure on a cell array region and a key region of a substrate, forming a first channel hole penetrating the first mold structure, forming a first sacrificial pillar in the first channel hole, forming a dummy hole penetrating the first dummy structure, forming a dummy pillar in the dummy hole, recessing an upper portion of the first dummy structure other than the dummy pillar to form a first protrusion in relation to a protruding upper portion of the dummy pillar, forming a second mold structure on the first mold structure, forming a second dummy structure on the first dummy structure, wherein an upper portion of the second dummy structure including a second protrusion is formed in relation to the first protrusion, opening the key region to selectively remove an uppermost dielectric layer of the second dummy structure, forming an interlayer dielectric layer on the second mold structure and the second dummy structure, wherein the interlayer dielectric layer on the key region includes a key pattern formed in relation to the second protrusion, and performing a photolithography process using the key pattern as an alignment key to form, on the first sacrificial pillar, a second channel hole penetrating the second mold structure.

BRIEF DESCRIPTION OF THE DRAWINGS

FIG. 5 is a plan (or top-down) view illustrating a semiconductor device according to embodiments of the inventive concept.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
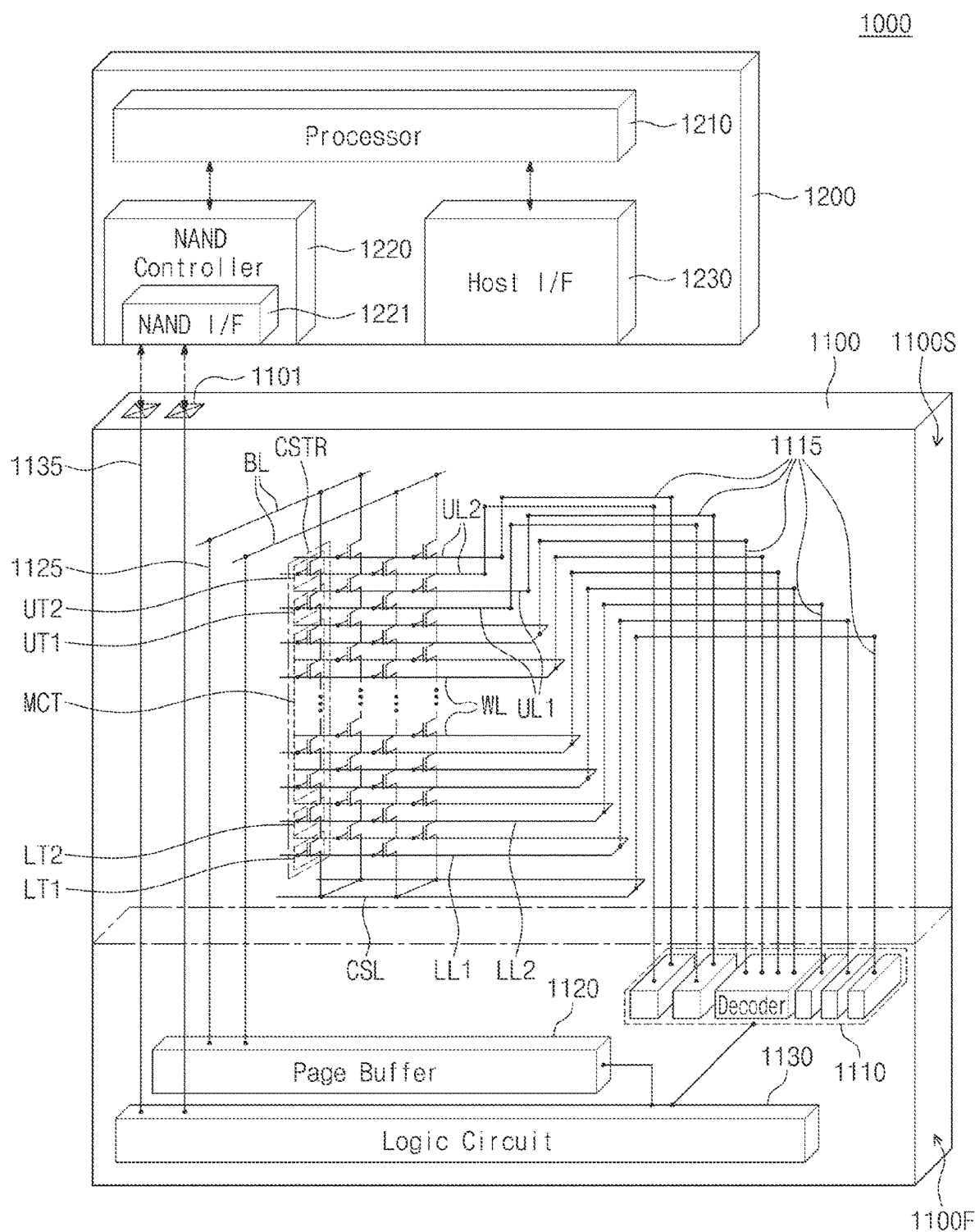
FIG. 1 is a block diagram illustrating an electronic system including a semiconductor device according to embodiments of the inventive concept.

FIG. 1 is a block diagram illustrating an electronic system 1000 including a semiconductor device according to embodiments of the inventive concept.

Referring to FIG. 1, the electronic system 1000 may generally include a semiconductor device 1100 and a controller 1200 electrically connected to the semiconductor device 1100. Here, the electronic system 1000 may be a storage device including one or more semiconductor devices 1100. Alternately, the electronic system 1000 may be an electronic device including the storage device. Exemplary electronic systems 1000 include a solid state drive (SSD) device, a universal serial bus (USB), a computing system, a medical apparatus, a communication apparatus, etc.

The semiconductor device 1100 may be a nonvolatile memory device, such as NAND flash memory device. The semiconductor device 1100 may include a first structure 1100F and a second structure 1100S disposed on the first structure 1100F. In some embodiments, the first structure 1100F may be disposed on a side of the second structure 1100S. The first structure 1100F may be a peripheral circuit structure including, for example, a decoder circuit 1110, a page buffer 1120 and/or a logic circuit 1130. The second structure 1100S may be a memory cell structure including, for example, bit lines BL, a common source line CSL, word lines WL, first and second gate upper lines UL1 and UL2, first and second gate lower lines LL1 and LL2, and memory cell strings CSTR between a bit line BL and the common source line CSL.

On the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may vary by design.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output (I/O) pad 1101 electrically connected to the logic circuit 1130. The I/O pad 1101 may be electrically connected to the logic circuit 1130 through an I/O connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, write data to-be-written to the memory cell transistors MCT of the semiconductor device 1100, and/or read data retrieved from the memory cell transistors MCT of the semiconductor device 1100. The host interface 1230 may enable communication between the electronic system 1000 and an external host (not shown). When a control command is received through the host interface 1230 from an external host, the semiconductor device 1100 may be controlled by the processor 1210 in response to the control command.

Figure 2:
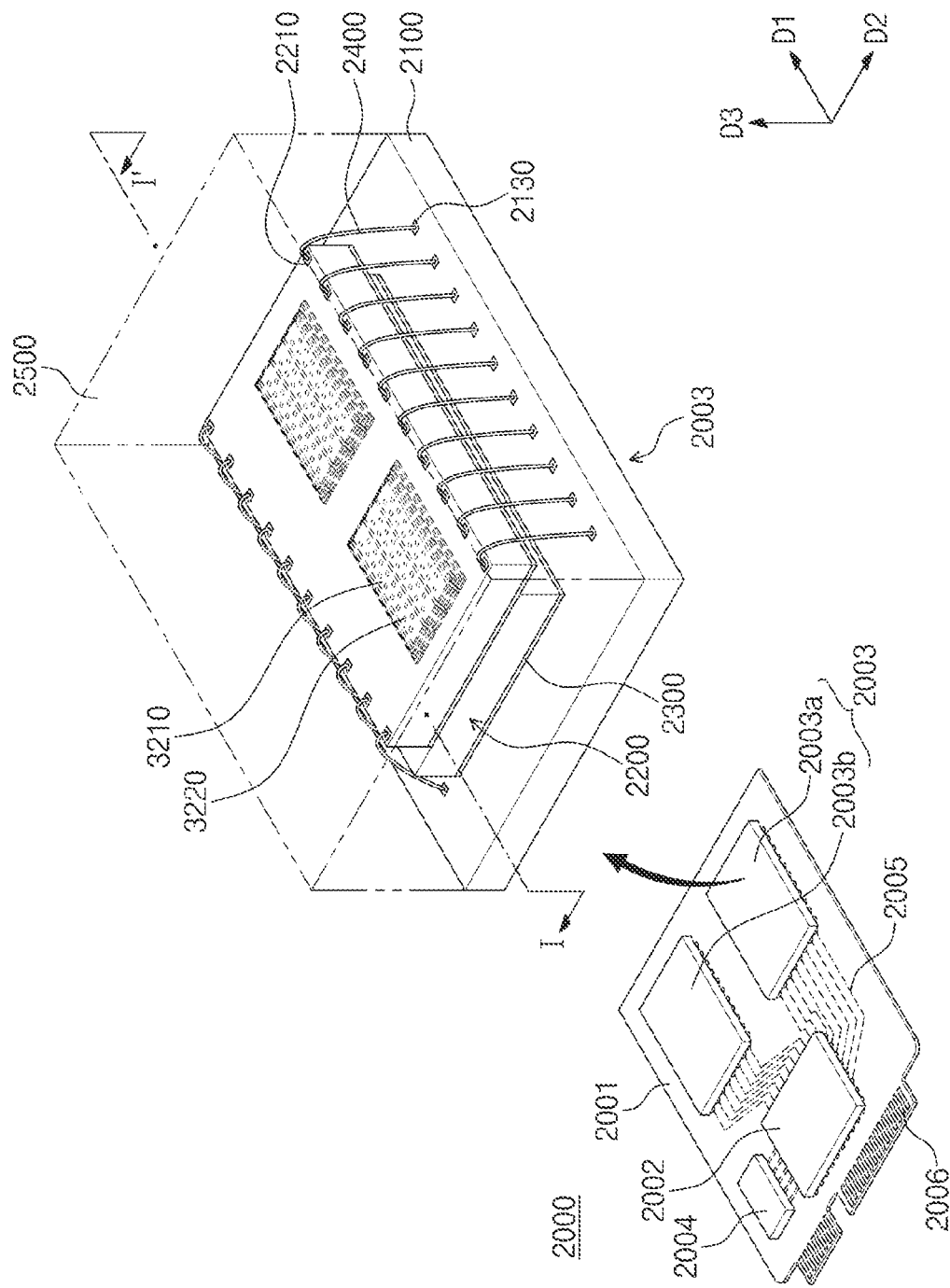
FIG. 2 is a perspective view illustrating an electronic system including a semiconductor device according to embodiments of the inventive concept.

FIG. 2 is a perspective view illustrating an electronic system 2000 including a semiconductor device according to embodiments of the inventive concept.

Referring to FIG. 2, the electronic system 2000 may include a main board 2001. Here, the main board 2001 may have a controller 2002, at least one semiconductor package 2003, and at least one dynamic random access memory (DRAM) 2004 mounted thereon. The semiconductor package 2003 and the DRAM 2004 may be connected to the controller 2002 through wiring patterns 2005 formed on the main board 2001.

The main board 2001 may include a connector 2006 including multiple pins providing various connection(s) with the external host. The number and arrangement of the pins on the connector 2006 will vary by choice of communication interface(s) between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from an external host. The electronic system 2000 may further include a power management integrated circuit (PMIC) that distributes the power supplied from the external host to the controller 2002 and the semiconductor package 2003.

The controller 2002 may read and/or write data to the semiconductor package 2003 in order to increase the overall operating speed of the electronic system 2000.

The DRAM 2004 may be a buffer memory that compensates for differences in operating speeds between the external host and the semiconductor package 2003 serving as a data storage device. Alternately or additionally, the DRAM 2004 included in the electronic system 2000 may operate as a cache memory providing temporary data storage space for various control operations performed by the semiconductor package 2003. When the DRAM 2004 is included in the electronic system 2000, the controller 2002 may include not only an NAND controller controlling the semiconductor package 2003, but also a DRAM controller controlling the DRAM 2004.

The semiconductor package 2003 may include a first semiconductor package 2003a and a second semiconductor package 2003b spaced apart from one another. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include one or more I/O pads 2210. The I/O pad 2210 may correspond to the I/O pad 1101 of FIG. 1. Each of the semiconductor chips 2200 may include gate stack structures 3210 and vertical structures 3220. Each of the semiconductor chips 2200 may include a semiconductor device like the semiconductor devices described hereafter.

In some embodiments, the connection structures 2400 may be bonding wires that electrically connect the I/O pads 2210 to the package upper pads 2130. Therefore, on each of the first and second semiconductor packages 2003a and 2003b, the semiconductor chips 2200 may be electrically connected to each other in a wire bonding manner, and may be electrically connected to the package upper pads 2130 of the package substrate 2100. In some embodiments, on each of the first and second semiconductor packages 2003a and 2003b, the semiconductor chips 2200 may be electrically connected to each other through connection structures such as through silicon vias instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
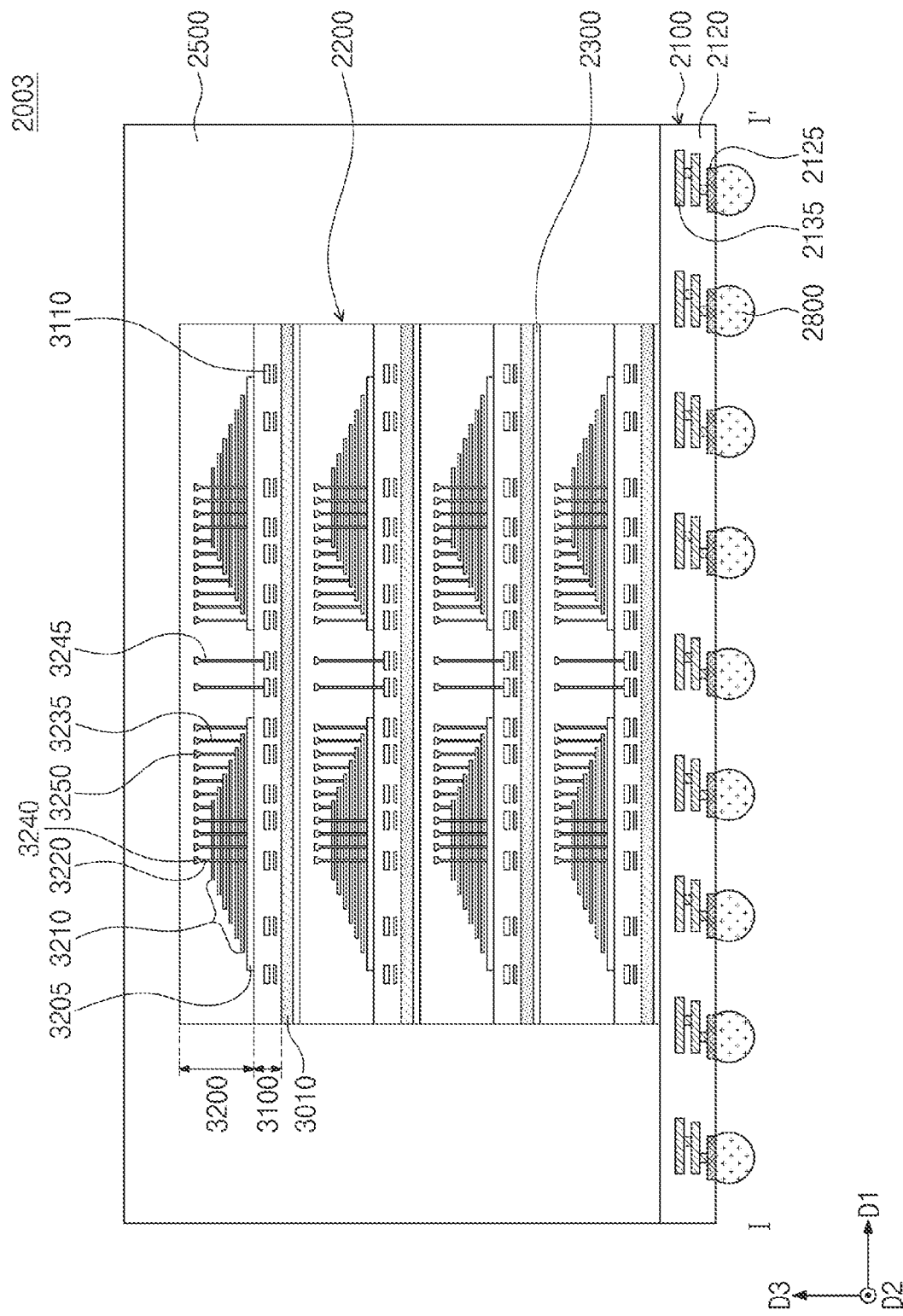
FIGS. 3 and 4 are respective cross-sectional views taken along line I-I' of FIG. 2.
Figure 4:
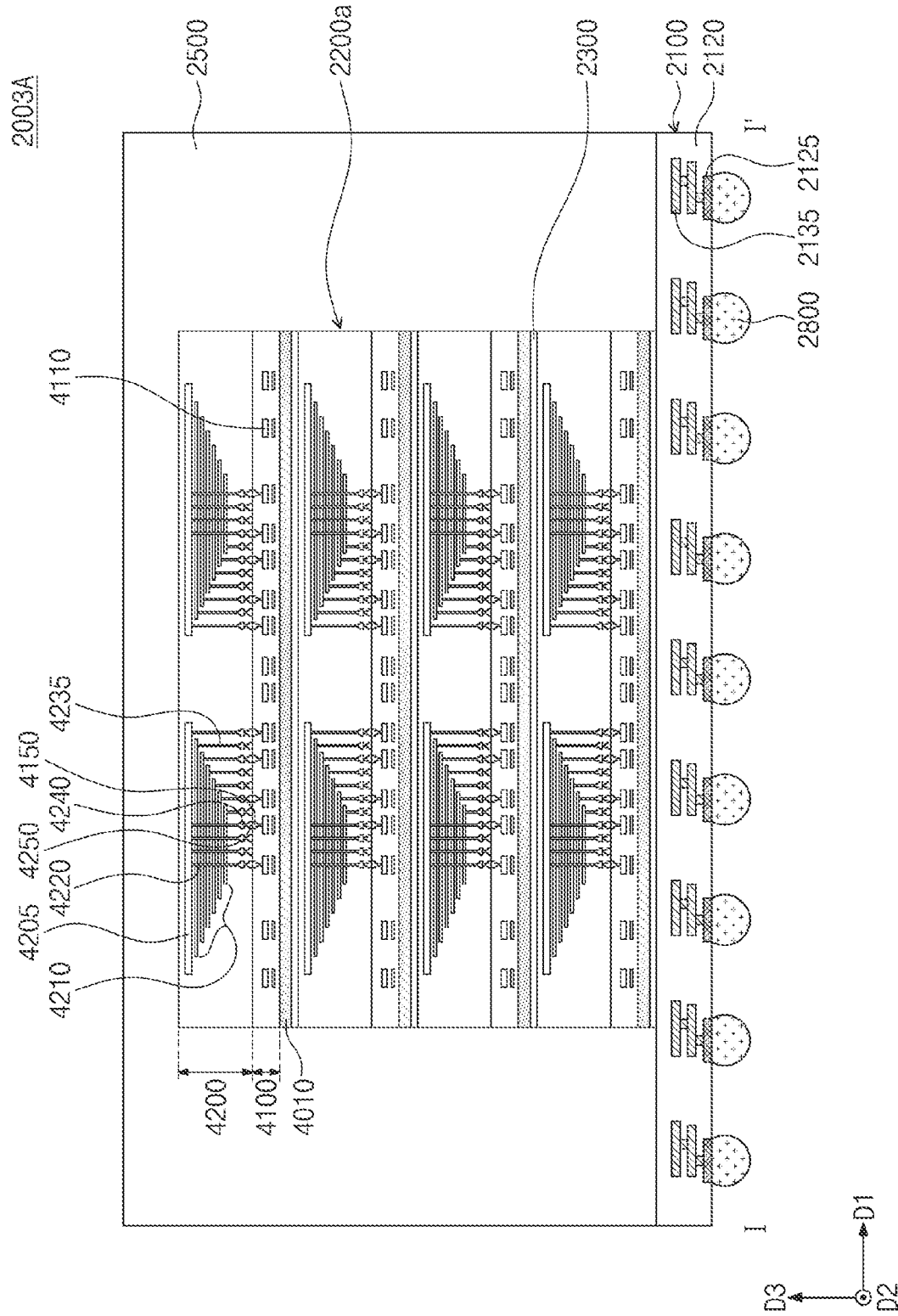

FIGS. 3 and 4 are respective cross-sectional views illustrating semiconductor packages according to embodiments of the inventive concept. Here, each one of FIGS. 3 and 4 further illustrates an example of the semiconductor package of FIG. 2 taken along line I-I'.

Referring to FIG. 3, a printed circuit board (PCB) may be used as the package substrate 2100 of the semiconductor package 2003. The package substrate 2100 may include a package substrate body 2120, package upper pads (see 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The upper pads 2130 may be electrically connected to the connection structures 2400. The lower pads 2125 may be connected through the conductive connectors 2800 to the wiring patterns 2005 of the main board 2001 in the electronic system 2000.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a source structure 3205, a stack structure 3210 on the source structure 3205 and vertical structures 3220 each of which penetrates the stack structure 3210, bit lines 3240 electrically connected to the vertical structures 3220, and cell contact plugs 3235 electrically connected to word lines (see WL of FIG. 1) of the stack structure 3210. Each of the first structure 3100, the second structure 3200, and the semiconductor chips 2200 may further include separation structures, as described hereafter.

Each of the semiconductor chips 2200 may include one or more through lines 3245 providing electrical connection(s) with the peripheral lines 3110 of the first structure 3100 and extending into the second structure 3200. The through line 3245 may be disposed external to (or outside of) the stack structure 3210 and may further be disposed to penetrate the stack structure 3210. Each of the semiconductor chips 2200 may further include one or more I/O pads (see 2210 of FIG. 2) electrically connected to the peripheral lines 3110 of the first structure 3100.

Referring to FIG. 4, a semiconductor package 2003A may be configured such that each of semiconductor chips 2200a includes a semiconductor substrate 4010, a first structure 4100 on the semiconductor substrate 4010, and a second structure 4200 disposed on and wafer-bonded to the first structure 4100.

The first structure 4100 may include a peripheral circuit region including peripheral lines 4110 and first bonding structures 4150. The second structure 4200 may include a source structure 4205, a stack structure 4210 between the source structure 4205 and the first structure 4100, and vertical structures 4220 each of which penetrates the stack structure 4210, and second bonding structures 4250 electrically connected to the vertical structures 4220 and word lines (see WL of FIG. 1) of the stack structure 4210. For example, the second bonding structures 4250 may be electrically connected to the vertical structures 4220 through bit lines 4240 electrically connecting the vertical structures 4220, and may also electrically connect the word lines (see WL of FIG. 1) through cell contact plugs 4235 electrically connecting the word lines (see WL of FIG. 1). In some embodiments, the first bonding structures 4150 of the first structure 4100 and the second bonding structures 4250 of the second structure 4200 may contact each other. The first and second bonding structures 4150 and 4250 may have their bonding portions formed of, for example, copper (Cu).

Each of the first structure 4100, the second structure 4200, and the semiconductor chip 2200a may further include a source structure, as described hereafter. Each of the semiconductor chips 2200a may further include one or more I/O pads (see 2210 of FIG. 2) electrically connected to the peripheral lines 4110.

The semiconductor chips 2200 of FIG. 3 may be electrically connected to each other through connection structures (see 2400 of FIG. 2) shaped like bonding wires, and this may also be applicable to the semiconductor chips 2200a of FIG. 4. In some embodiments, semiconductor chips (e.g., the semiconductor chips 2200 of FIG. 3 or the semiconductor chips 2200a of FIG. 4) in a single semiconductor package may be electrically connected to each other through one or more connection structures including through electrodes, such as through silicon vias (TSVs).

The first structure 3100 of FIG. 3 and the first structure 4100 of FIG. 4 may correspond to a peripheral circuit structure described hereafter, and the second structure 3200 of FIG. 3 and the second structure 4200 of FIG. 4 may correspond to a cell array structure described hereafter.

Figure 6A:
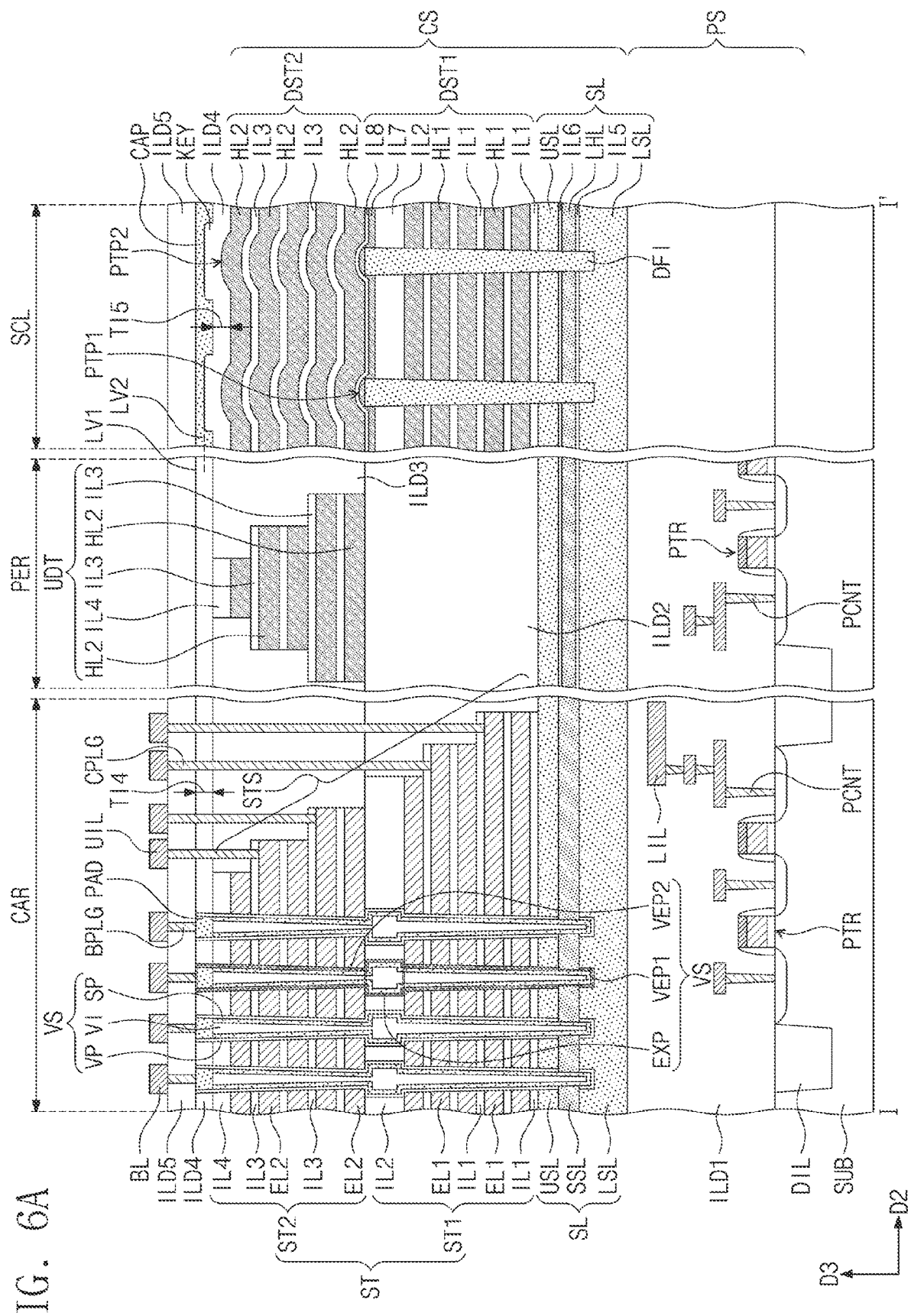
FIG. 6A is a cross-sectional view taken along line I-I' of FIG. 5.

FIG. 5 is a plan view illustrating a semiconductor device according to embodiments of the inventive concept. FIG. 6A is a cross-sectional view taken along line I-I' of FIG. 5, and FIG. 6B is a cross-sectional view taken along line II-II' of FIG. 5.

Figure 6B:
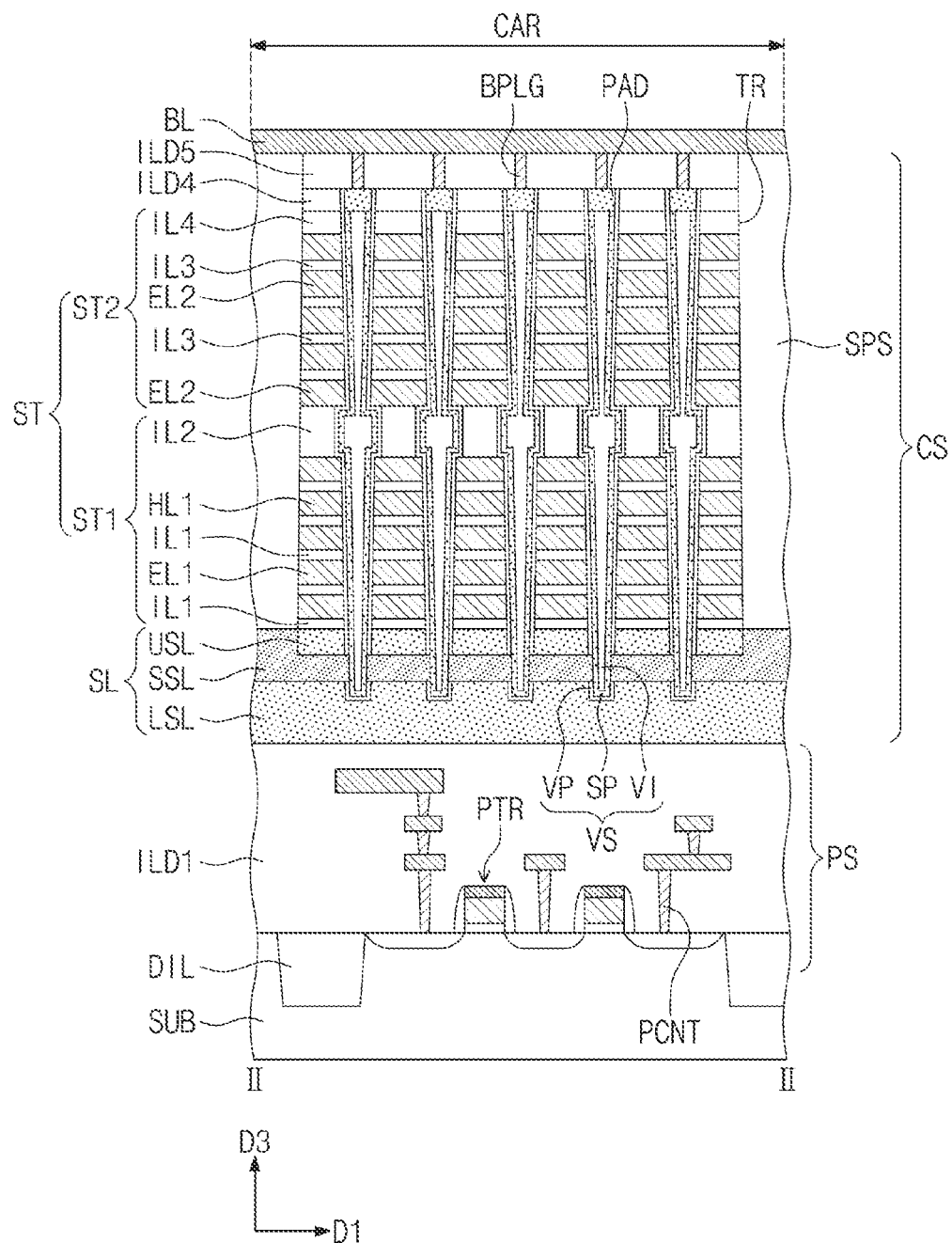
FIG. 6B is a cross-sectional view taken along line II-II' of FIG. 5.

Referring to FIGS. 5, 6A, and 6B, a peripheral circuit structure PS including peripheral transistors PTR may be provided in a first substrate SUB, and a cell array structure CS including a stack structure ST may be provided on the peripheral circuit structure PS. The first substrate SUB may be a silicon substrate, a silicon-germanium substrate, a germanium substrate, or a single crystalline epitaxial layer grown on a single crystalline silicon substrate. The first substrate SUB may include active regions defined by a device isolation layer DIL.

The peripheral circuit structure PS may include peripheral transistors PTR disposed on the active regions of the first substrate SUB. The peripheral transistors PTR, described above, may constitute row and column decoders, a page buffer, a control circuit, and a peripheral logic circuit.

The peripheral circuit structure PS may include a peripheral circuit including, for example, a decoder circuit, a page buffer, and a logic circuit. The peripheral circuit structure PS may further include lower wiring lines LIL provided on the peripheral transistors PTR and a first interlayer dielectric layer ILD1 covering the peripheral transistors PTR and the lower wiring lines LIL. A peripheral contact PCNT may be provided between and electrically connect the lower wiring line LIL and the peripheral transistor PTR. The first interlayer dielectric layer ILD1 may include stacked dielectric layers. For example, the first interlayer dielectric layer ILD1 may include one or more of a silicon oxide layer, a silicon nitride layer, a silicon oxynitride layer, and a low-k dielectric layer. A cell array structure CS may be provided on the first interlayer dielectric layer ILD1 of the peripheral circuit structure PS. The cell array structure CS will be described in some additional detail hereafter.

A second substrate SL may be provided on the first interlayer dielectric layer ILD1. The second substrate SL may include, for example, a cell array region CAR, a peripheral region PER, and a key region SCL. The peripheral region PER may be disposed between the cell array region CAR and the key region SCL. The peripheral region PER may be an outer area of a semiconductor chip. The key region SCL may be a scribe lane area of a semiconductor chip.

The second substrate SL may support a stack structure ST provided on the cell array region CAR, an upper dummy structure UDT provided on the peripheral region PER, and a dummy structure DST provided on the key region SCL.

The second substrate SL may include a lower semiconductor layer LSL, a source semiconductor layer SSL, and an upper semiconductor layer USL sequentially stacked in the cell array region CAR. Each of the lower semiconductor layer LSL, the source semiconductor layer SSL, and the upper semiconductor layer USL may include a semiconductor material, such as silicon (Si), germanium (Ge), silicon-germanium (SiGe), gallium-arsenic (GaAs), indium-gallium-arsenic (InGaAs), aluminum-gallium-arsenic (AlGaAs), or a combination thereof. Each of the lower semiconductor layer LSL, the source semiconductor layer SSL, and the upper semiconductor layer USL may be single-crystalline, amorphous, or polycrystalline. For example, each of the lower semiconductor layer LSL, the source semiconductor layer SSL, and the upper semiconductor layer USL may include a polysilicon layer into which impurities are doped to have an n-type conductivity. The lower semiconductor layer LSL, the source semiconductor layer SSL, and the upper semiconductor layer USL may have different impurity concentrations.

The source semiconductor layer SSL may be interposed between the lower semiconductor layer LSL and the upper semiconductor layer USL. The source semiconductor layer SSL may electrically connect the lower semiconductor layer LSL to the upper semiconductor layer USL. For example, the upper semiconductor layer USL and the source semiconductor layer SSL may vertically (e.g., in a third direction D3) overlap the lower semiconductor layer LSL.

The second substrate SL may include a lower semiconductor layer LSL, a fifth dielectric layer IL5, a lower sacrificial layer LHL, a sixth dielectric layer IL6, and an upper semiconductor layer USL sequentially stacked in the peripheral region PER and the key region SCL. The fifth and sixth dielectric layers IL5 and IL6 may include a silicon oxide layer, and the lower sacrificial layer LHL may include a silicon nitride layer or a silicon oxynitride layer.

The stack structure ST may be provided on the second substrate SL of the cell array region CAR. The stack structure ST may include a first stack structure ST1 and a second stack structure ST2 on the first stack structure ST1. The second substrate SL may be provided thereon with a second interlayer dielectric layer ILD2 and a third interlayer dielectric layer ILD3. The second interlayer dielectric layer ILD2 may have a top surface coplanar with that of the first stack structure ST1. The third interlayer dielectric layer ILD3 may have a top surface coplanar with that of the second stack structure ST2. The second and third interlayer dielectric layers ILD2 and ILD3 may cover a stepwise structure STS of the stack structure ST.

The first stack structure ST1 may include first electrodes EL1 vertically stacked (e.g., in the third direction D3) on the second substrate SL. The first stack structure ST1 may further include first dielectric layers IL1 respectively separating the stacked first electrodes EL1. The first stack structure ST1 may be configured such that the first dielectric layers IL1 and the first electrodes EL1 are alternately and vertically stacked. A second dielectric layer IL2 may be provided on top of the first stack structure ST1. Here, the second dielectric layer IL2 may be thicker than each of the first dielectric layers IL1.

The second stack structure ST2 may include second electrodes EL2 that are stacked in the third direction D3 on the first stack structure ST1. The second stack structure ST2 may further include third dielectric layers IL3 that separate the stacked second electrodes EL2 from each other. The second stack structure ST2 may be configured such that the third dielectric layers IL3 and the second electrodes EL2 are alternately stacked in the third direction D3. A fourth dielectric layer IL4 may be provided at top of the second stack structure ST2. The fourth dielectric layer IL4 may be thicker than each of the third dielectric layers IL3.

The stack structure ST may extend horizontally (e.g., in a second direction D2) from the cell array region CAR toward the peripheral region PER. The stack structure ST may have a stepwise structure STS. The stepwise structure STS of the stack structure ST may have a height that deceases with deceasing distance from the peripheral region PER. For example, the stepwise structure STS of the stack structure ST may have a height that decreases in the second direction D2.

A lowermost one of the first electrodes EL1 of the stack structure ST may be a lower selection line (e.g., the first gate lower line LL1 of FIG. 1). An uppermost one of the second electrodes EL2 of the stack structure ST may be an upper selection line (e.g., the first gate upper line UL1 of FIG. 1). The first and second electrodes EL1 and EL2 other than the lower and upper selection lines may be word lines (e.g., the word lines WL of FIG. 1).

The first and second electrodes EU and EL2 may include one or more conductive material(s) such as doped semiconductor (e.g., doped silicon), metals (e.g., tungsten, copper, or aluminum), conductive metal nitrides (e.g., titanium nitride or tantalum nitride), and transition metals (e.g., titanium or tantalum). The first to fourth dielectric layers IL1 to IL4 may include a silicon oxide layer.

On the cell array region CAR, a plurality of vertical channel structures VS may be provided to penetrate the stack structure ST. Each of the vertical channel structures VS may have a diameter that gradually decreases with decreasing distance from the second substrate SL.

Each of the vertical channel structures VS may include a vertical dielectric pattern VP, a vertical semiconductor pattern SP, and a buried dielectric pattern VI. The vertical semiconductor pattern SP may be interposed between the vertical dielectric pattern VP and the buried dielectric pattern VI. A conductive pad (PAD) may be provided on an upper portion of each of the vertical channel structures VS.

The buried dielectric pattern VI may have cylindrical shape. The vertical semiconductor pattern SP may cover a surface of the buried dielectric pattern VI and may extend in the third direction D3 from the lower semiconductor layer LSL toward the conductive pad. The vertical semiconductor pattern SP may have a pipe shape whose top end is opened. The vertical dielectric pattern VP may cover an outer surface of the vertical semiconductor pattern SP and may extend vertically from the lower semiconductor layer LSL towards a top surface of a fourth interlayer dielectric layer ILD4, as described hereafter. Thus, the vertical dielectric pattern VP may have a pipe shape having an open top end. The vertical dielectric pattern VP may be interposed between the stack structure ST and the vertical semiconductor pattern SP.

The vertical dielectric pattern VP may be formed of a single thin layer or multiple thin layers. In some embodiments, the vertical dielectric pattern VP may include a data storage layer. In some embodiments, the vertical dielectric pattern VP may include a tunnel dielectric layer, a charge storage layer, and a blocking dielectric layer that may be collectively used as a data storage layer in a NAND flash memory device. For example, the charge storage layer may be a trap dielectric layer, a floating gate electrode, or a dielectric layer including conductive nano-dots. The charge storage layer may include one or more of a silicon nitride layer, a silicon oxynitride layer, a silicon-rich nitride layer, a nano-crystalline silicon layer, and a laminated trap layer.

The vertical semiconductor pattern SP may include a semiconductor material, such as silicon (Si), germanium (Ge), or a mixture thereof. Additionally or alternatively, the vertical semiconductor pattern SP may be an impurity-doped semiconductor or an undoped intrinsic semiconductor. The vertical semiconductor pattern SP including a semiconductor material may be used as a channel of transistors that constitute a memory cell string.

The conductive pad (PAD) may cover a top surface of the vertical semiconductor pattern SP and a top surface of the buried dielectric pattern VI. The conductive pad may include one or more of an impurity-doped semiconductor material and a conductive material. A bit-line contact plug BPLG may be electrically connected through the conductive pad to the vertical semiconductor pattern SP.

The source semiconductor layer SSL may directly contact a lower sidewall of each of the vertical semiconductor patterns SP. The source semiconductor layer SSL may electrically connect a plurality of vertical semiconductor patterns SP to each other. For example, the vertical semiconductor patterns SP may be electrically connected to the second substrate SL. The second substrate SL may serve as a source of memory cells. A common source voltage may be applied to the second substrate SL.

Each of the vertical channel structures VS may include a first vertical extension VEP1 that penetrates the first stack structure ST1, a second vertical extension VEP2 that penetrates the second stack structure ST2, and an expansion EXP between the first and second vertical extensions VEP1 and VEP2. The expansion EXP may be provided in the second dielectric layer IL2.

The first vertical extension VEP1 may have a diameter that increases as it extends to an upper portion from a lower portion thereof. The second vertical extension VEP2 may have a diameter that increases as it extends to an upper portion from a lower portion thereof. The expansion EXP may have a diameter greater than a maximum diameter of each of the first and second vertical extensions VEP1 and VEP2.

Separation structures SPS may penetrate the stack structure ST, thereby dividing the stack structure ST into horizontally separated structures. For example, the separation structures SPS may divide one electrode EL1 or EL2 of the stack structure ST into horizontally separated electrodes. The separation structures SPS may include a dielectric material, such as silicon oxide.

The upper dummy structure UDT may be provided on the second interlayer dielectric layer ILD2 of the peripheral region PER. The upper dummy structure UDT may have a bottom surface coplanar with that of the second stack structure ST2, and may have a top surface coplanar with that of the second stack structure ST2.

The upper dummy structure UDT may include second sacrificial layers HL2 that are stacked in the third direction D3 on the second interlayer dielectric layer ILD2. The upper dummy structure UDT may further include third dielectric layers IL3 that separates the stacked second sacrificial layers HL2. A fourth dielectric layer IL4 may be provided on top of the upper dummy structure UDT.

The upper dummy structure UDT may serve as a buffer structure between the stack structure ST of the cell array region CAR and the dummy structure DST of the key region SCL.

The dummy structure DST may be provided on the second substrate SL of the key region SCL. The dummy structure DST may include a first dummy structure DST1 and a second dummy structure DST2 on the first dummy structure DST1.

The first dummy structure DST1 may include first sacrificial layers HL1 that are stacked in the third direction D3 on the second substrate SL. The first dummy structure DST1 may further include first dielectric layers IL1 that separate the stacked first sacrificial layers HL1. The first dummy structure DST1 may be configured such that the first sacrificial layers HL1 and the first dielectric layers IL1 are alternately and vertically stacked. A second dielectric layer IL2 may be provided on top of the first dummy structure DST1. The second dielectric layer IL2 of the first dummy structure DST1 may have a thickness less than that of the second dielectric layer IL2 of the first stack structure ST1.

On the key region SCL, dummy pillars DFI may be provided to penetrate the first dummy structure DST1. Each of the dummy pillars DFI may have a diameter that gradually decreases with decreasing distance from the second substrate SL. The diameter of each dummy pillar DFI may be greater than or equal to that of the vertical channel structure VS. Each of the dummy pillars DFI may have an upper portion that protrudes upward from the second dielectric layer IL2. The dummy pillars DFI may include polysilicon, for example.

The first dummy structure DST1 may further include a seventh dielectric layer IL7 and an eighth dielectric layer IL8 on the second dielectric layer IL2. The seventh and eighth dielectric layers IL7 and IL8 may include a first protrusion PTP1 formed due to a protruding upper portion of the dummy pillar DFI.

The second dummy structure DST2 may include second sacrificial layers HL2 vertically stacked on the first dummy structure DST1. The second dummy structure DST2 may further include third dielectric layers IL3 that respectively separate the vertically stacked second sacrificial layers HL2. The second dummy structure DST2 may be configured such that the second sacrificial layers HL2 and the third dielectric layers IL3 are alternately and vertically stacked.

An uppermost one of the second sacrificial layers HL2 of the second dummy structure DST2 may include a second protrusion PTP2 formed due to the first protrusion PTP1 of the first dummy structure DST1. The second protrusion PTP2 may vertically overlap the dummy pillar DFI.

A fourth interlayer dielectric layer ILD4 may be provided on the stack structure ST, the upper dummy structure UDT, the dummy structure DST, and the third interlayer dielectric layer ILD3. The fourth interlayer dielectric layer ILD4 on the key region SCL may have a top surface at a lower level than that of a top surface of the fourth interlayer dielectric layer ILD4 on the cell array region CAR.

The fourth interlayer dielectric layer ILD4 may include key patterns KEY formed on an upper portion of the key region SCL. Each of the key patterns KEY may be formed due to the second protrusion PTP2 of the dummy structure DST. For example, the key pattern KEY may vertically overlap the dummy pillar DFI. The key patterns KEY may be used as alignment keys during (e.g.) a photolithography process used (e.g.) to form the vertical channel structures VS On the cell array region CAR, the fourth interlayer dielectric layer ILD4 on the stack structure ST may have a top surface at a first level LV1. On the key region SCL, the fourth interlayer dielectric layer ILD4 or the key pattern KEY may have a top surface at a second level LV2. Here, the second level LV2 may be lower than the first level LV1.

On the stack structure ST, the fourth interlayer dielectric layer ILD4 may have a fourth thickness TI4. On the dummy structure DST, the fourth interlayer dielectric layer ILD4 may have a fifth thickness TI5, wherein the fifth thickness TI5 is greater than the fourth thickness TI4.

A capping layer CAP may be provided on the fourth interlayer dielectric layer ILD4 on the key region SCL. The capping layer CAP may cover the key patterns KEY. The capping layer CAP may have a top surface coplanar with that of the fourth interlayer dielectric layer ILD4 on the cell array region CAR. For example, the top surface of the capping layer CAP may be located at the first level LV1. The capping layer CAP may include a material different from that of the fourth interlayer dielectric layer ILD4. In some embodiments, the capping layer CAP may include the same material as that of the dummy pillars DFI (e.g., polysilicon).

A fifth interlayer dielectric layer ILD5 may be provided on the fourth interlayer dielectric layer ILD4 and the capping layer CAP. Bit-line contact plugs BPLG may penetrate the fifth interlayer dielectric layer ILD5 to correspondingly connect the conductive pads PAD. Bit lines BL may be disposed on the fifth interlayer dielectric layer ILD5. The bit lines BL may extend in parallel in a first direction D1. The bit lines BL may be electrically connected through the bit-line contact plugs BPLG to corresponding vertical channel structures VS.

Cell contact plugs CPLG may penetrate the second to fifth interlayer dielectric layers ILD2 to ILD5 to correspondingly connect the first and second electrodes EL1 and EL2 that constitute the stepwise structure STS. Upper wiring lines UIL may be disposed on the fifth interlayer dielectric layer ILD5, and may correspondingly connect through the cell contact plugs CPLG to the first and second electrodes EL1 and EL2.

In some embodiments, the key pattern KEY on the key region SCL may completely remain without change in its shape. Accordingly, the second vertical extension VEP2 that penetrates the second stack structure ST2 may be exactly aligned with the first vertical extension VEP1 penetrating the first stack structure ST1. Thus, the first and second vertical extensions VEP1 and VEP2 may be stably connected. As a result, it may be possible to increase reliability and the overall electrical performance of semiconductor devices according to embodiments of the inventive concept.

FIGS. 7A, 8A, 9A, 10A, 11A, 12A, 13A, 14A, 15A, and 16A are respective cross-sectional views taken along line I-I' of FIG. 5, and FIGS. 7B, 8B, 9B, 10B, 11B, 12B, 13B, 14B, 15B, and 16B are respective cross-sectional views taken along line II-II' of FIG. 5. Collectively, these views illustrate in one example a method of fabricating a semiconductor device according to embodiments of the inventive concept.

Figure 7A:
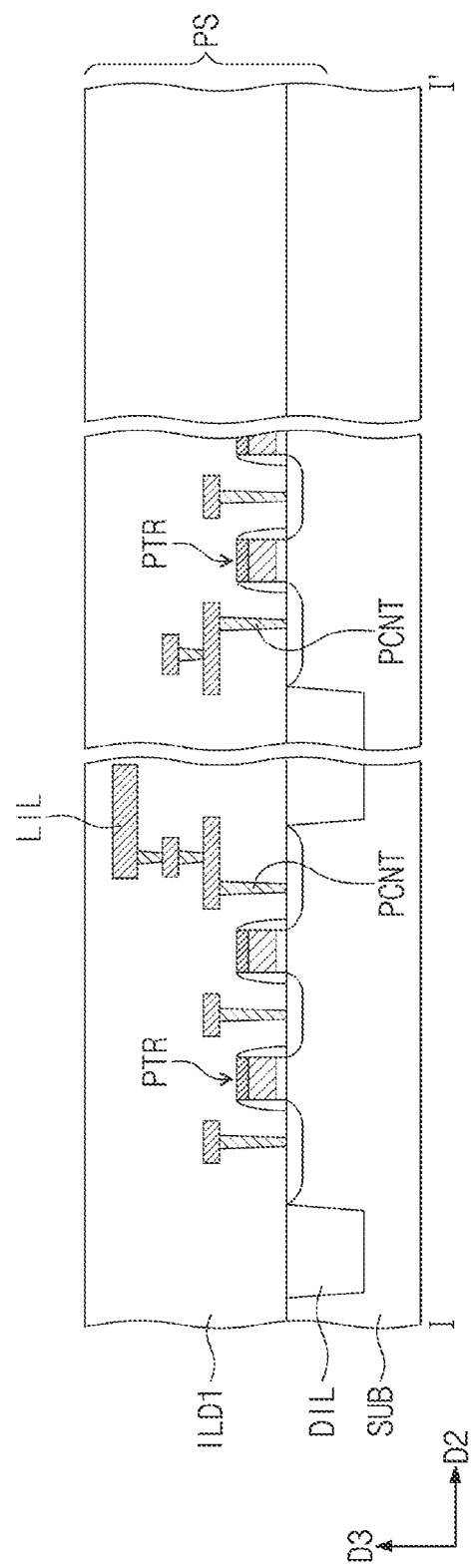
FIGS. 7A, 8A, 9A, 10A, 11A, 12A, 13A, 14A, 15A, and 16A are respective cross-sectional views taken along line I-I' of FIG. 5, and FIGS. 7B, 8B, 9B, 10B, 11B, 12B, 13B, 14B, 15B, and 16B are respective cross-sectional views taken along line II-II' of FIG. 5. Collectively, these drawings illustrate in one example a method of fabricating a semiconductor device according to embodiments of the inventive concept.
Figure 7B:
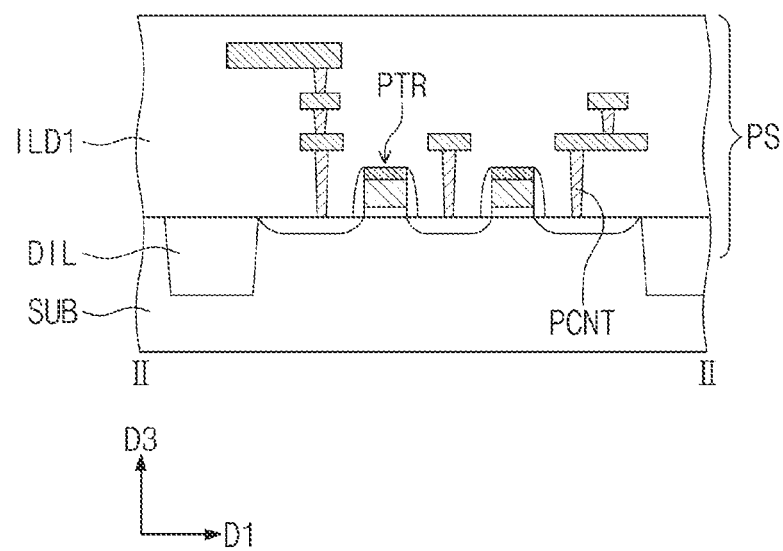

Referring to FIGS. 5, 7A, and 7B, a peripheral circuit structure PS may be formed on a first substrate SUB. The formation of the peripheral circuit structure PS may include forming peripheral transistors PTR on the first substrate SUB and forming lower wiring lines LIL on the peripheral transistors PTR. For example, the formation of the peripheral transistors PTR may include forming on the first substrate SUB a device isolation layer DIL that defines active regions, forming on the active regions a gate dielectric layer and a gate electrode, and implanting the active regions with impurities to form source/drain regions. A first interlayer dielectric layer ILD1 may be formed to cover the peripheral transistors PTR and the lower wiring lines LIL.

Figure 8A:
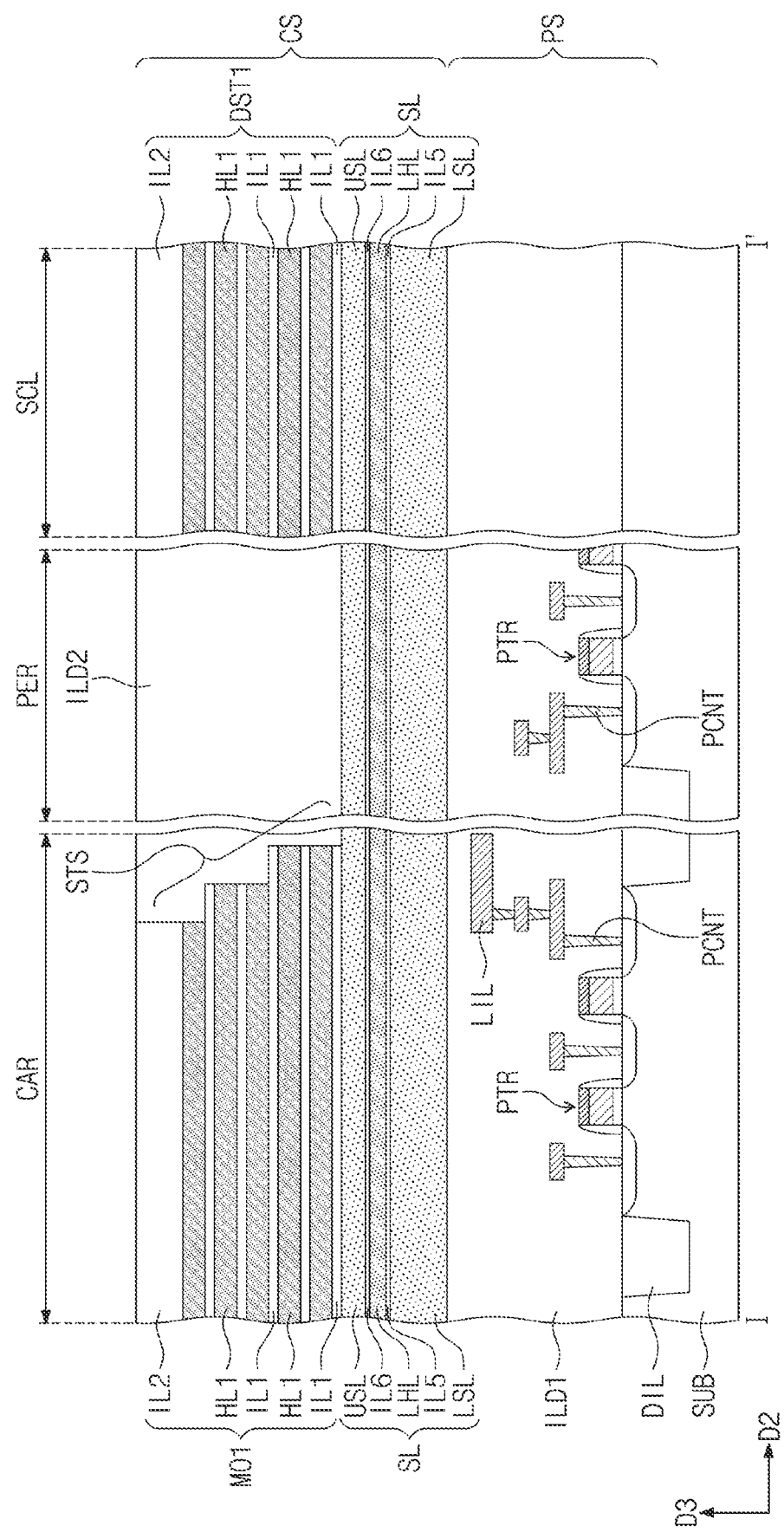
Figure 8B:
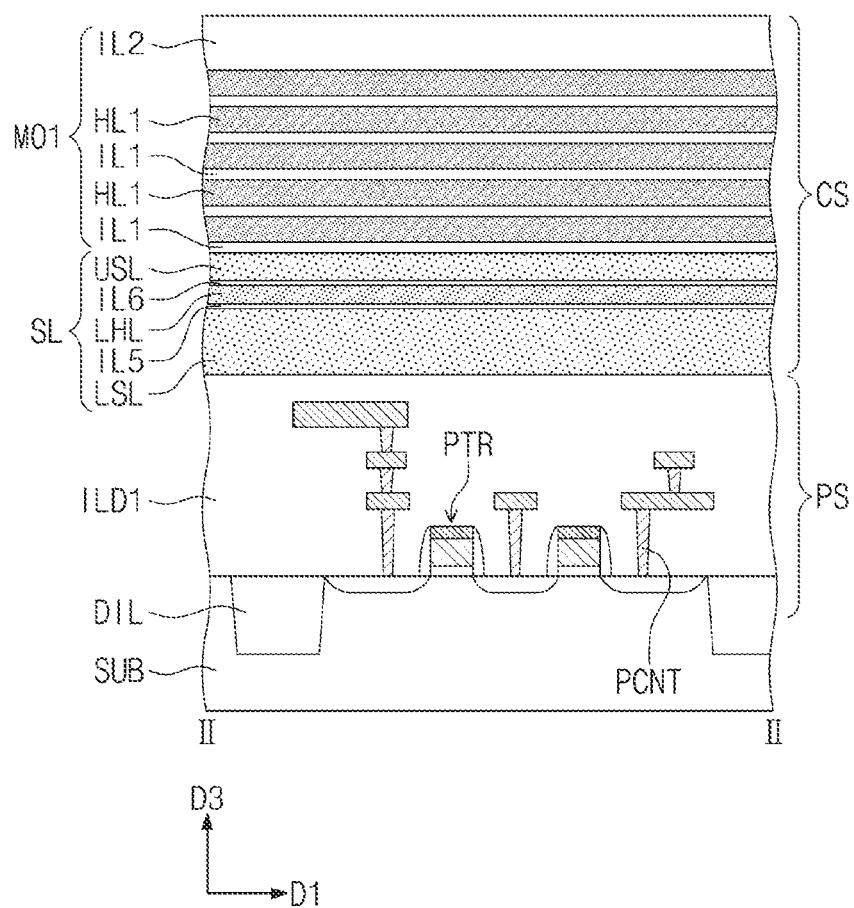

Referring to FIGS. 5, 8A, and 8B, a second substrate SL may be formed on the first interlayer dielectric layer ILD1. The formation of the second substrate SL may include sequentially forming a lower semiconductor layer LSL, a fifth dielectric layer IL5, a lower sacrificial layer LHL, a sixth dielectric layer IL6, and an upper semiconductor layer USL. For example, the lower semiconductor layer LSL and the upper semiconductor layer USL may include a semiconductor material, such as polysilicon. The fifth and sixth dielectric layers IL5 and IL6 may include a silicon oxide layer, and the lower sacrificial layer LHL may include a silicon nitride layer or a silicon oxynitride layer. The second substrate SL may include a cell array region CAR, a peripheral region PER, and a key region SCL.

A first mold structure MO1 may be formed on the cell array region CAR of the second substrate SL. For example, the first mold structure MO1 may be formed by alternately stacking first dielectric layers IL1 and first sacrificial layers HL1 on the upper semiconductor layer USL. A second dielectric layer IL2 may be formed at top of the first mold structure MO1.

The first dielectric layers ILL the first sacrificial layers HL1, and the second dielectric layer IL2 may be deposited by using thermal chemical vapor deposition (CVD), plasma enhanced CVD, physical CVD process, or atomic layer deposition (ALD). The first dielectric layers IL1 and the second dielectric layer IL2 may include a silicon oxide layer, and the first sacrificial layers HL1 may include a silicon nitride layer or a silicon oxynitride layer.

A stepwise structure STS may be formed at an end of the first mold structure MO1. For example, the first mold structure MO1 may undergo a cyclic process to form the stepwise structure STS on the cell array region CAR. The formation of the stepwise structure STS may include forming a mask pattern (not shown) on the first mold structure MO1 and using the mask pattern to repeatedly perform the cyclic process several times. The cyclic process may include using the mask pattern as an etching mask to partially etch the first mold structure MO1 and then performing a trimming process to reduce the mask pattern.

A first dummy structure DST1 may be formed on the key region SCL of the second substrate SL. The first dummy structure DST1 may be formed simultaneously with the first mold structure MO1. For example, the first dummy structure DST1 may be formed by alternately stacking first dielectric layers IL1 and first sacrificial layers HL1 on the upper semiconductor layer USL.

A second interlayer dielectric layer ILD2 may be formed on the first mold structure MO1 and the first dummy structure DST1. The formation of the second interlayer dielectric layer ILD2 may include forming a dielectric layer to cover the first mold structure MO1 and allowing the dielectric layer to undergo a planarization process until the second dielectric layer IL2 is exposed.

Figure 9A:
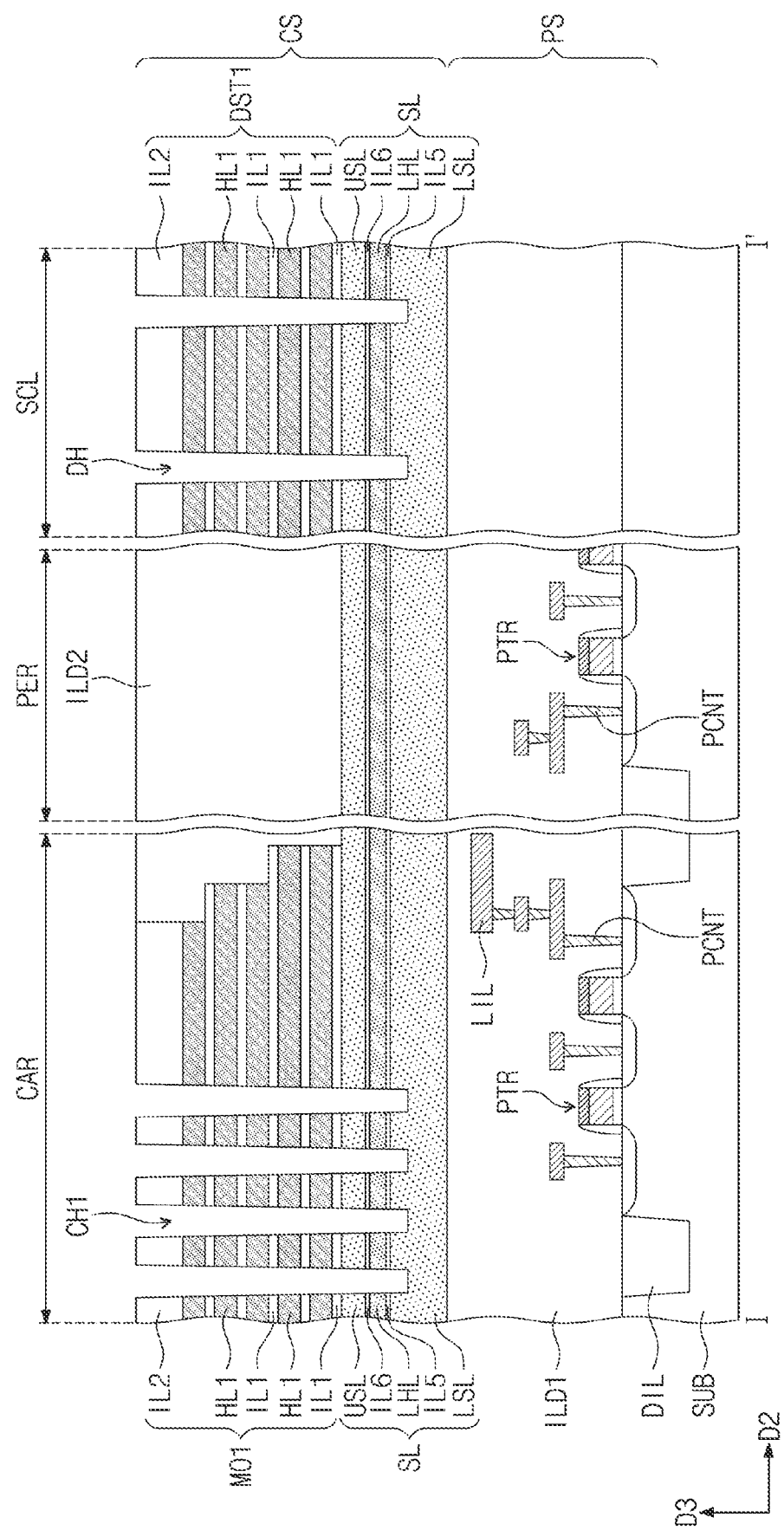
Figure 9B:
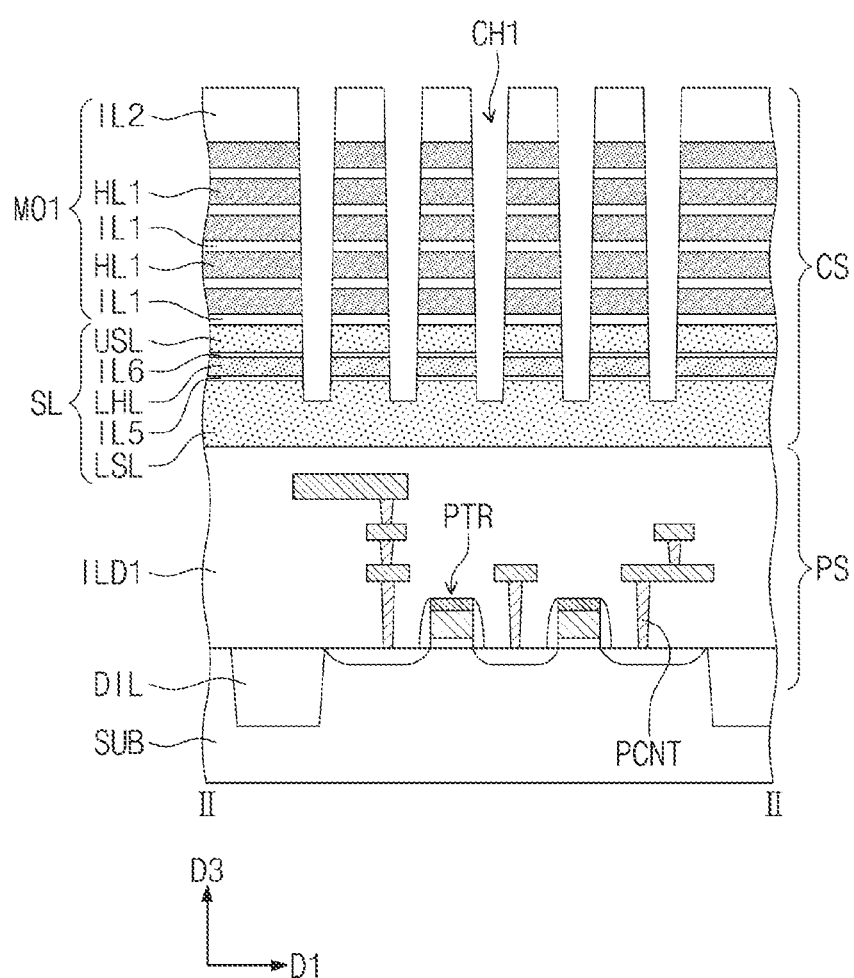

Referring to FIGS. 5, 9A, and 9B, first channel holes CH1 may be formed to penetrate the first mold structure MO1 on the cell array region CAR. Dummy holes DH may be formed to penetrate the first dummy structure DST1 on the key region SCL. The first channel holes CH1 and the dummy holes DH may expose the lower semiconductor layer LSL.

For example, the formation of the first channel holes CH1 and the dummy holes DH may include forming on the first mold structure MO1 and the first dummy structure DST1 a mask pattern (not shown) having an opening that define areas on which holes will be formed, and using the mask pattern as an etching mask to perform an anisotropic etching process to anisotropically etch the first mold structure MO1 and the first dummy structure DST1. The anisotropic etching process may include a plasma etching process, a reactive ion etching (RIE) process, a high-frequency inductively coupled plasma reactive ion etching (ICP-RIE) process, or an ion beam etching (IBE) process.

According to some embodiments, the patterning process for forming the first channel holes CH1 and the dummy holes DH may include a lithography process using extreme ultraviolet ("EUV") radiation. In this regard, the term "EUV" denotes an ultraviolet ray having a wavelength ranging from about 4 nm to about 124 nm, an ultraviolet ray having a wavelength more narrowly ranging from about 4 nm to about 20 nm, and/or an ultraviolet ray having a wavelength still more narrowly of about 13.5 nm. Further, the term EUV denotes light energy ranging from about 6.21 eV to about 124 eV, and/or light energy more narrowly ranging from about 90 eV to about 95 eV.

The lithography process using EUV may include exposure and development processes that use EUV irradiated onto the photoresist layer. For example, the photoresist layer may be an organic photoresist that contains an organic polymer such as polyhydroxystyrene. The organic photoresist may further include a photosensitive compound that is sensitive to the EUV. The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed with a relatively thin thickness. The photoresist layer exposed to EUV may be developed to form photoresist patterns. Here, the photoresist patterns may have a linear shape extending in one direction, an island shape, a zigzag shape, a honeycomb shape, or a circular shape, but the inventive concept is not limited thereto.

The photoresist patterns may be used as an etching mask to pattern one or more mask layers that are stacked below the photoresist patterns, and thus mask patterns may be formed. The mask patterns may be used as an etching mask to pattern a target layer to form desired patterns on a wafer.

As a comparative example, a multi-patterning technique (MPT) conventionally used requires the use of two or more photomasks to form fine-pitched patterns on a wafer. In contrast, when an EUV lithography process is performed according to embodiments of the inventive concept, only a single photomask may be used to form the first channel holes CH1 having a fine pitch.

For example, a value less than or equal to about 45 nm may be given as a minimum pitch between the first channel holes CH1 formed by an EUV lithography process according to the embodiments of the inventive concept. Hence, the EUV lithography process used to form the first channel holes CH1 in embodiments of the inventive concept is sufficient to form very fine patterns without requiring multiple patterning processes.

A pattern density of the first channel holes CH1 may be greater than that of the dummy holes DH. For example, the number of the first channel holes CH1 per unit area may be greater than a number of dummy holes DH per the unit area. Each of the first channel holes CH1 may be less than or equal to each of the dummy holes DH.

Figure 10A:
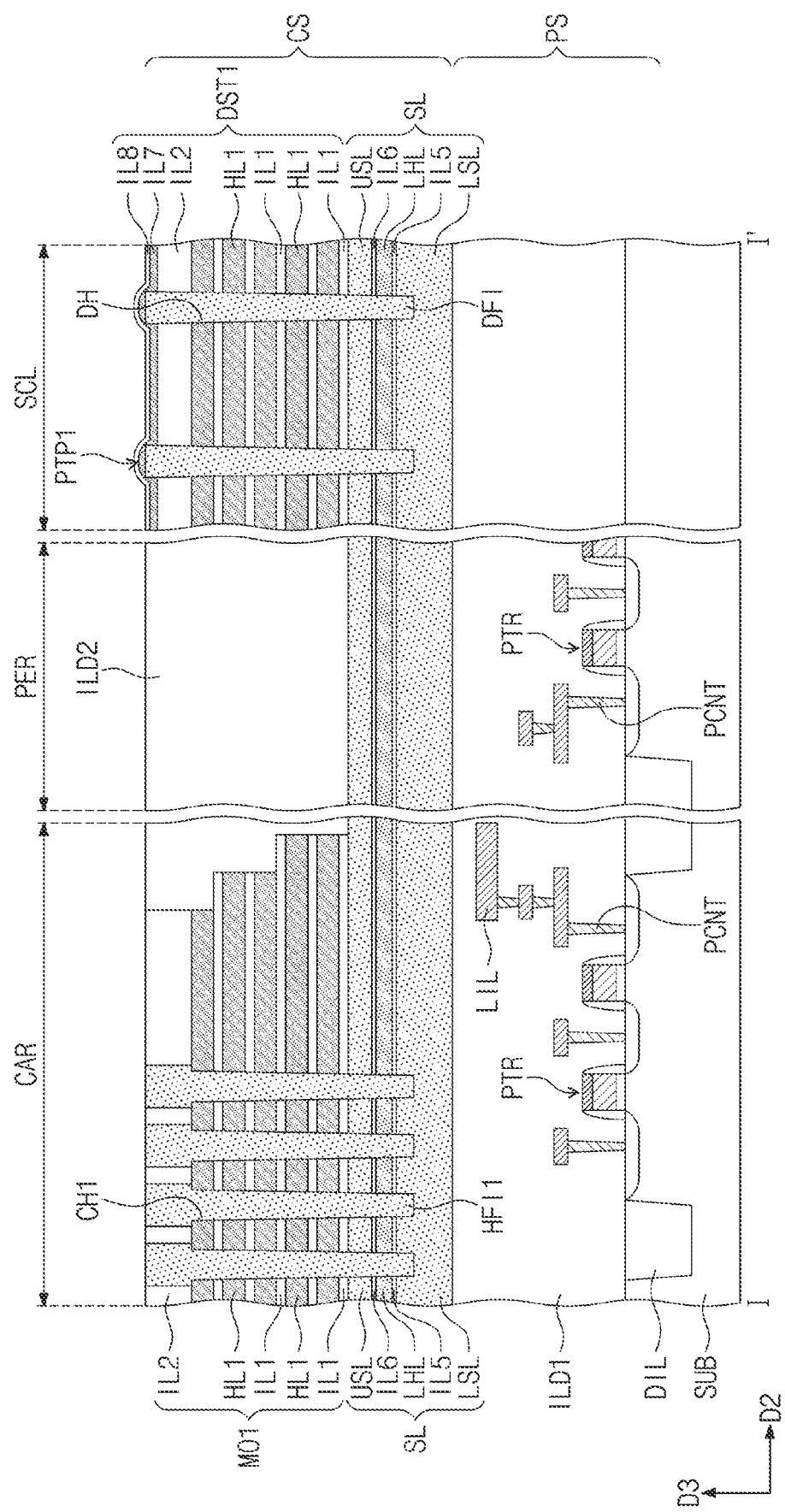
Figure 10B:
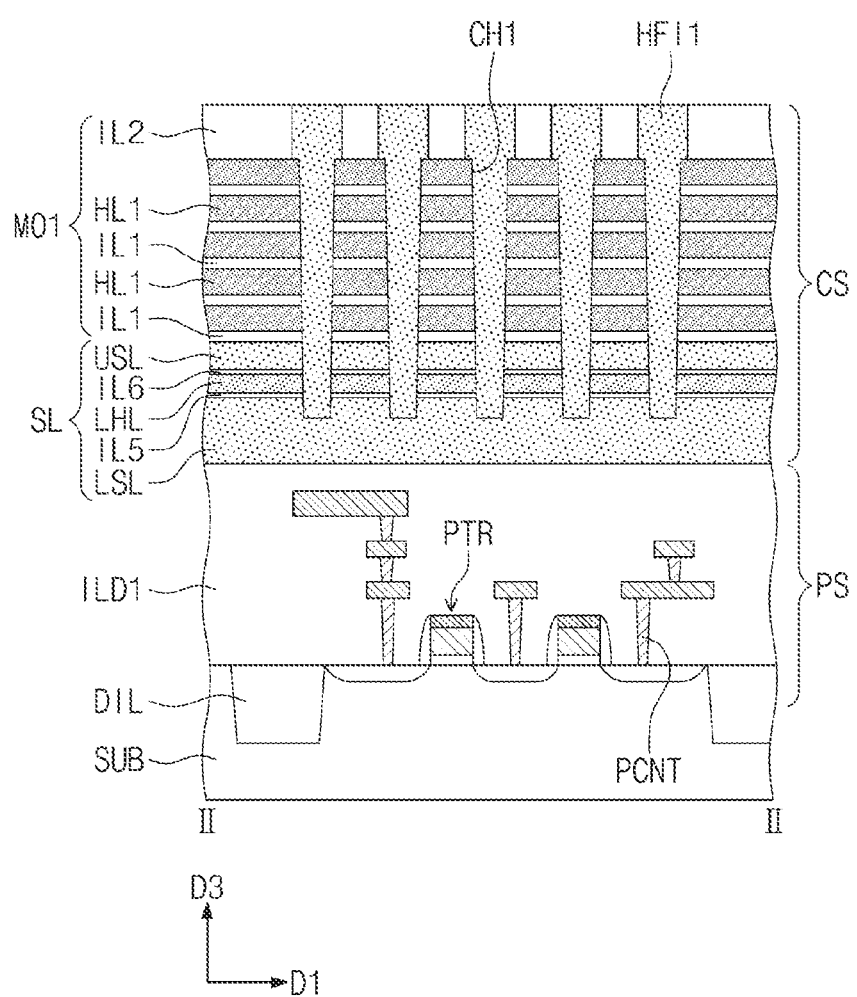

Referring to FIGS. 5, 10A, and 10B, each of the first channel holes CH1 may be expanded at its upper portion. Therefore, the diameter of the first channel hole CH1 may be remarkably increased in the second dielectric layer IL2.

First sacrificial pillars HFI1 may be formed to fill corresponding first channel holes CH1. Dummy pillars DFI may be formed to fill corresponding dummy holes DH. For example, the formation of the first sacrificial pillars HFI1 and the dummy pillars DFI may include forming a first sacrificial mask layer to fill the first channel holes CH1 and the dummy holes DH, and planarizing the first sacrificial mask layer until a top surface of the second dielectric layer IL2 is exposed. The first sacrificial mask layer may include polysilicon, for example.

The second dielectric layer IL2 on the key region SCL may be selectively recessed to expose an upper portion of each of the dummy pillars DFI. A seventh dielectric layer IL7 and an eighth dielectric layer IL8 may be sequentially formed on the exposed dummy pillars DFI. The seventh and eighth dielectric layers IL7 and IL8 may be deposited along a profile of the exposed upper portion of the dummy pillar DFI, and thus first protrusions PTP1 may be formed to protrude upward on an upper portion of the seventh and eighth dielectric layers IL7 and IL8. The first protrusions PTP1 may vertically overlap corresponding dummy pillars DFI. The seventh dielectric layer IL7 may include a silicon nitride layer or a silicon oxynitride layer. The eighth dielectric layer IL8 may include a silicon oxide layer.

Figure 11A:
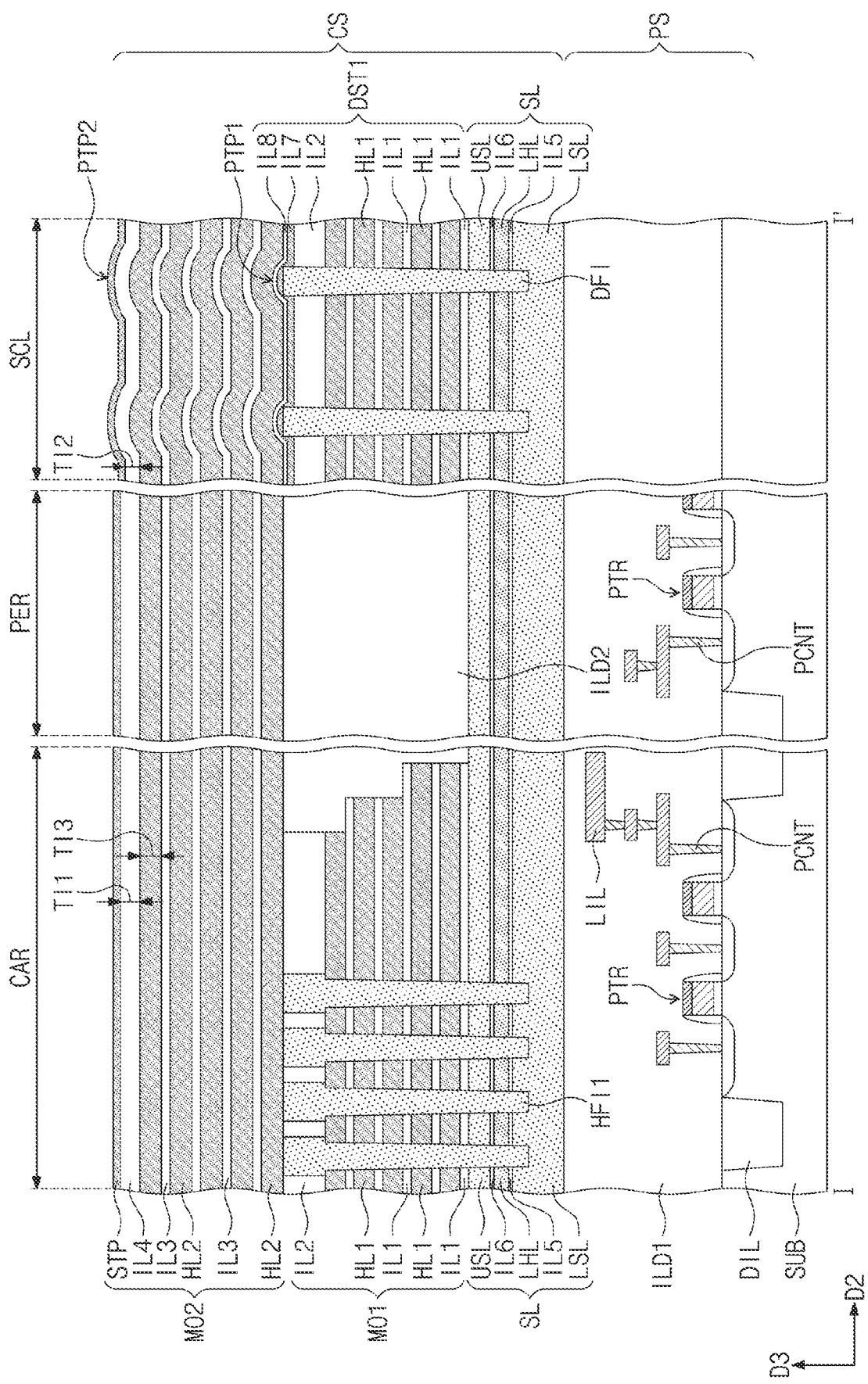
Figure 11B:
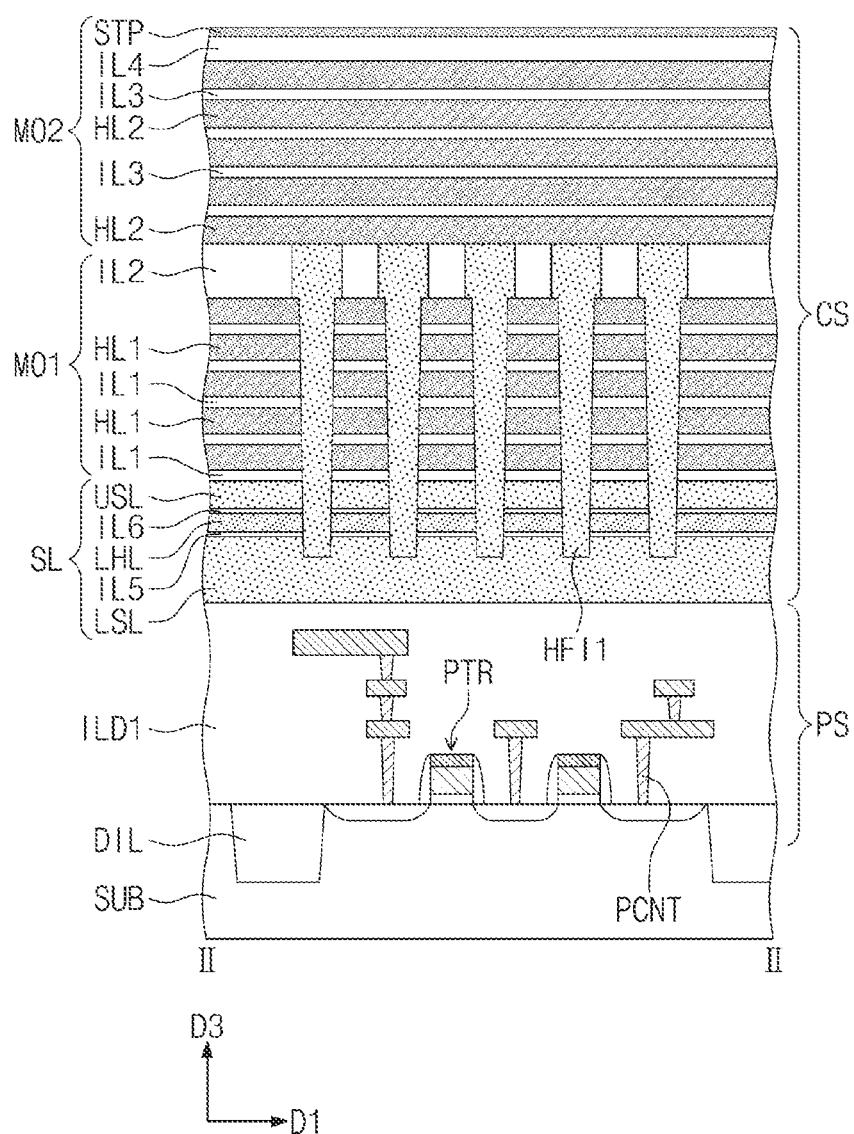

Referring to FIGS. 5, 11A, and 11B, a second mold structure MO2 may be formed on the entire surface of the second substrate SL. For example, the second mold structure MO2 may be formed by alternately stacking third dielectric layers IL3 and second sacrificial layers HL2 on the first mold structure MO1, the second interlayer dielectric layer ILD2, and the first dummy structure DST1. A fourth dielectric layer IL4 and a stopper layer STP may be formed at top of the second mold structure MO2. The third dielectric layers IL3 and the fourth dielectric layer IL4 may include a silicon oxide layer, and the second sacrificial layers HL2 and the stopper layer STP may include a silicon nitride layer or a silicon oxynitride layer.

The fourth dielectric layer IL4 on the key region SCL may be selectively recessed to be lower than a top surface of the fourth dielectric layer IL4 on the cell array region CAR. The fourth dielectric layer IL4 on the cell array region CAR may have a first thickness TI1, and the fourth dielectric layer IL4 on the key region SCL may have a second thickness TI2. The first thickness TI1 may be greater than the second thickness TI2. The second sacrificial layer HL2 at top of the second mold structure MO2 may have a third thickness TI3. A difference between the first thickness TI1 and the second thickness TI2 may be less than twice the third thickness TI3 (i.e., TI1−TI2<2×TI3).

The second mold structure MO2 on the key region SCL may be deposited on the first protrusions PTP1 of the first dummy structure DST1, and thus the first protrusions PTP1 may cause formation of second protrusions PTP2 on an upper portion of the second mold structure MO2. The second protrusions PTP2 may vertically overlap corresponding first protrusions PTP1.

Figure 12A:
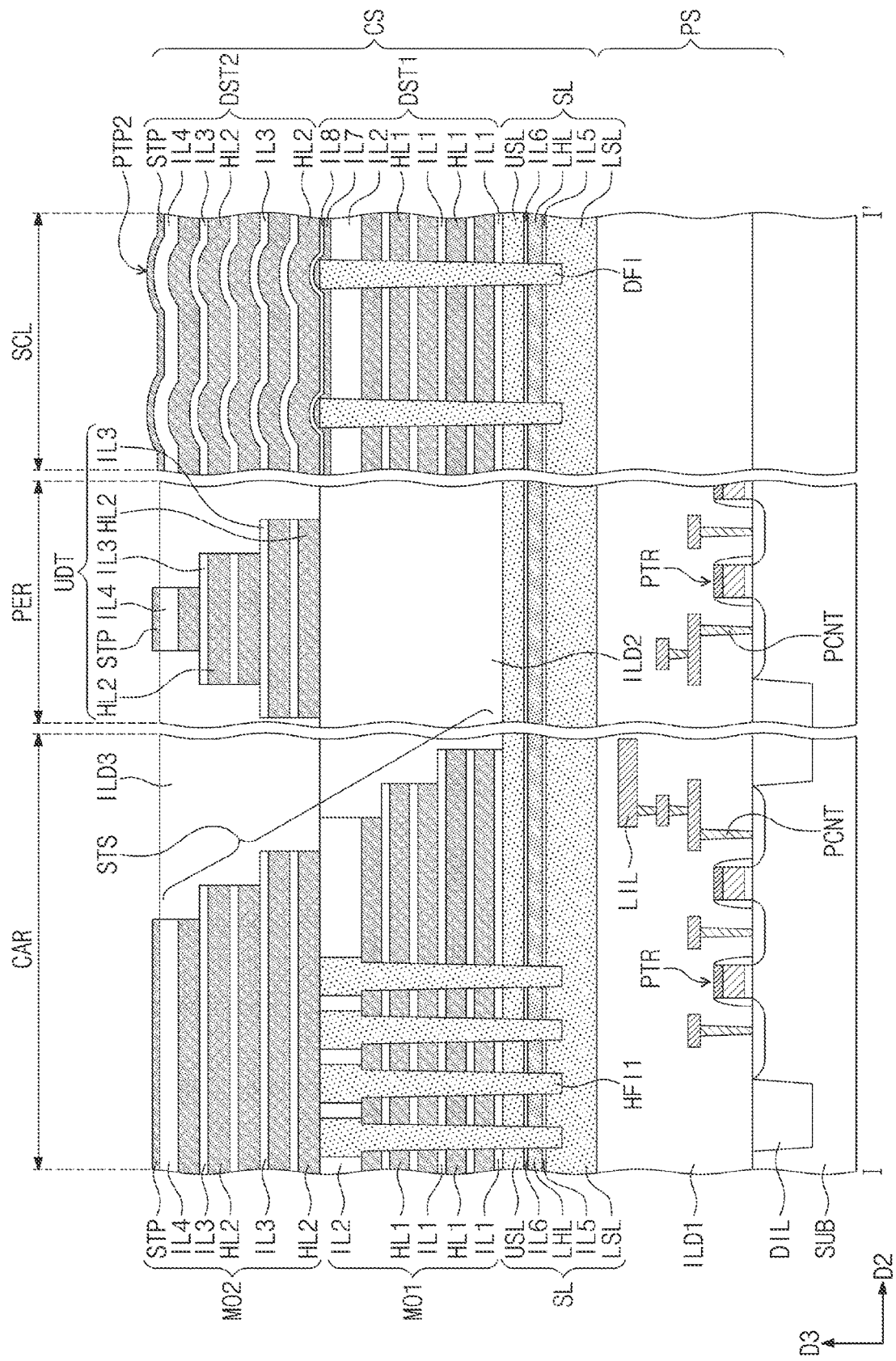
Figure 12B:
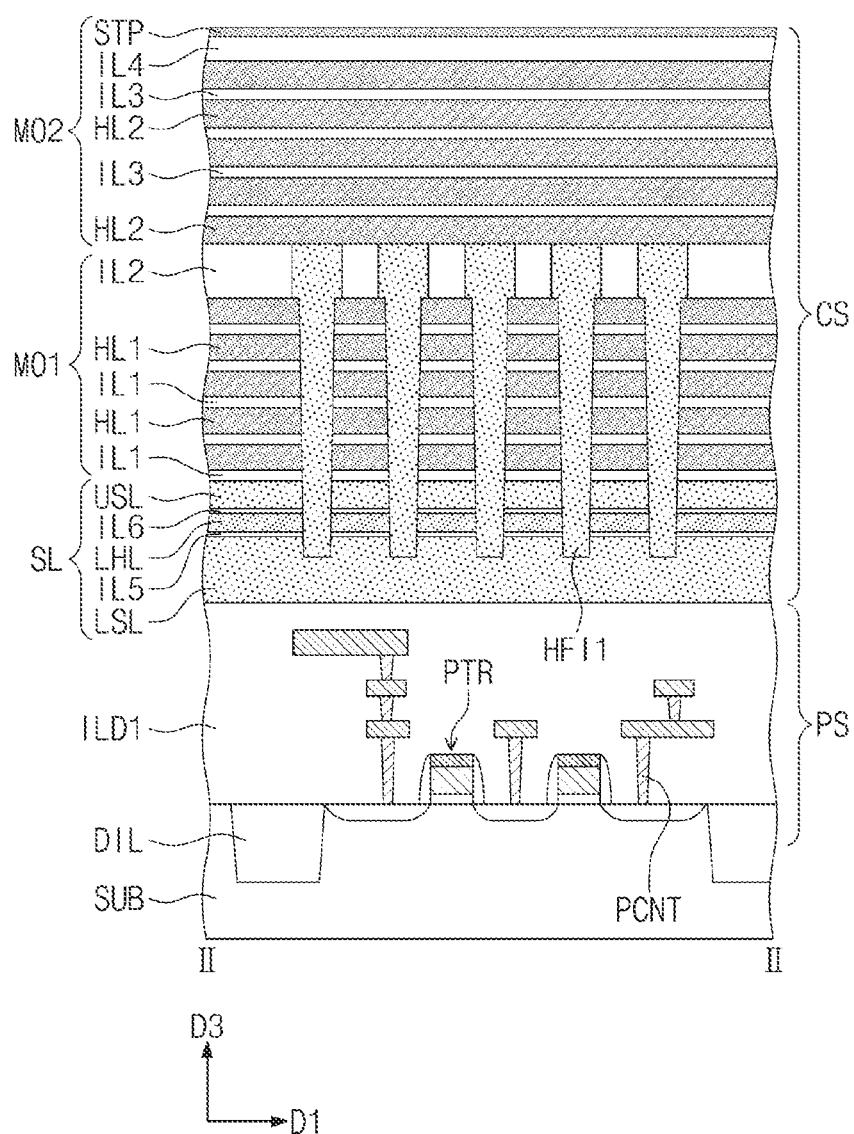

Referring to FIGS. 5, 12A, and 12B, on the cell array region CAR, the second mold structure MO2 may be patterned to form a stepwise structure STS. The formation of the stepwise structure STS on the second mold structure MO2 on the cell array region CAR may be the same as the formation of the stepwise structure STS on the first mold structure MO1 discussed above.

On the peripheral region PER, the second mold structure MO2 may be patterned to form an upper dummy structure UDT. When the stepwise structure STS is formed on the cell array region CAR, the upper dummy structure UDT may be formed together with the stepwise structure STS.

The second mold structure MO2 on the key region SCL may remain intact. The second mold structure MO2 remaining on the key region SCL may constitute a second dummy structure DST2 on the first dummy structure DST1.

A third interlayer dielectric layer ILD3 may be formed to cover the second mold structure MO2, the upper dummy structure UDT, and the second dummy structure DST2. The formation of the third interlayer dielectric layer ILD3 may include forming a dielectric layer to cover the second mold structure MO2, the upper dummy structure UDT, and the second dummy structure DST2, and then performing on the dielectric layer a planarization process until the stopper layer STP is exposed.

Figure 13A:
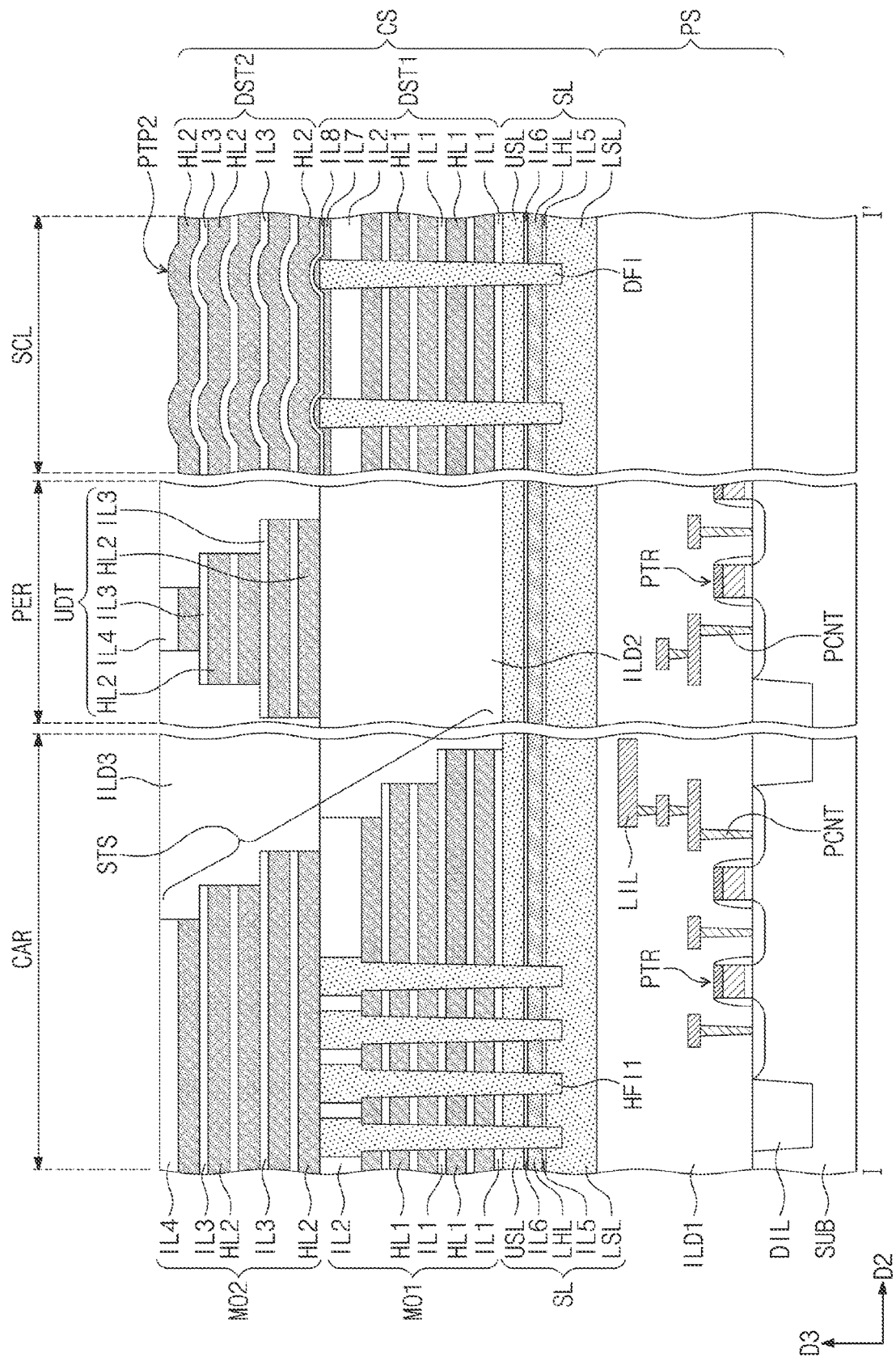
Figure 13B:
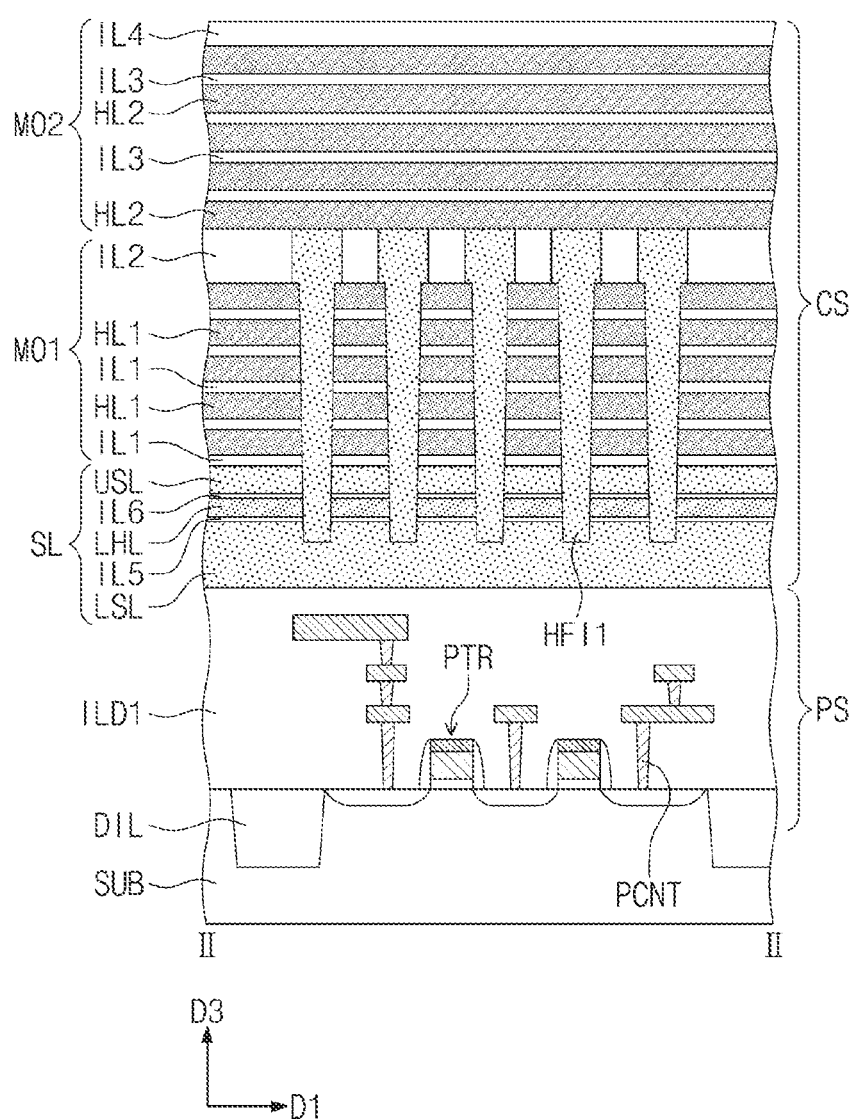

Referring to FIGS. 5, 13A, and 13B, the remaining stopper layer STP may be selectively removed. After the removal of the stopper layer STP, a buffing chemical mechanical polishing (CMP) may be performed to remove a step difference between the peripheral region PER and the key region SCL.

A photoresist may be formed to selectively open the key region SCL, and then the fourth dielectric layer IL4 may be selectively removed from the key region SCL. The removal of the fourth dielectric layer IL4 may expose the second sacrificial layer HL2 at top on the key region SCL.

Figure 14A:
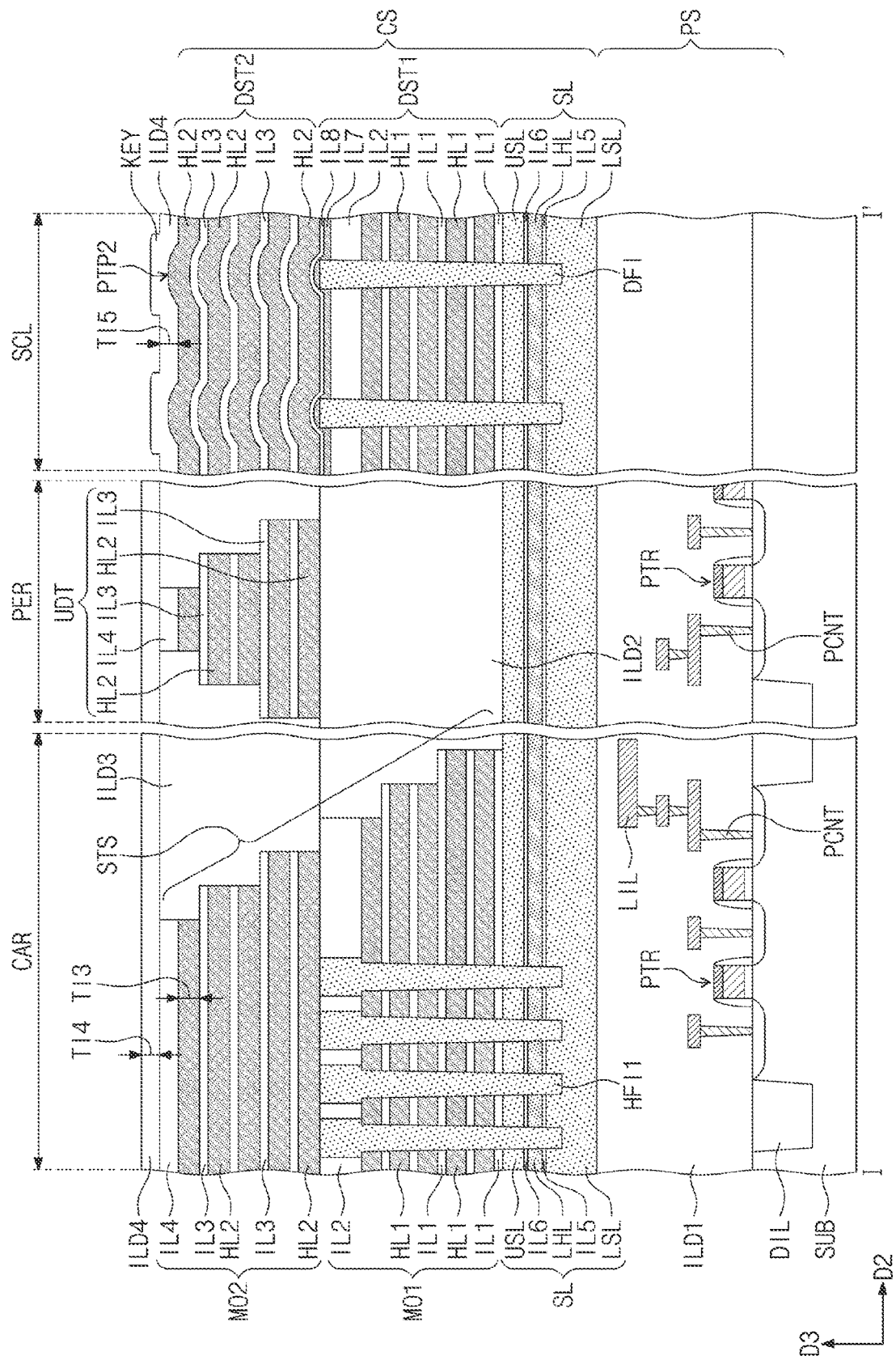
Figure 14B:
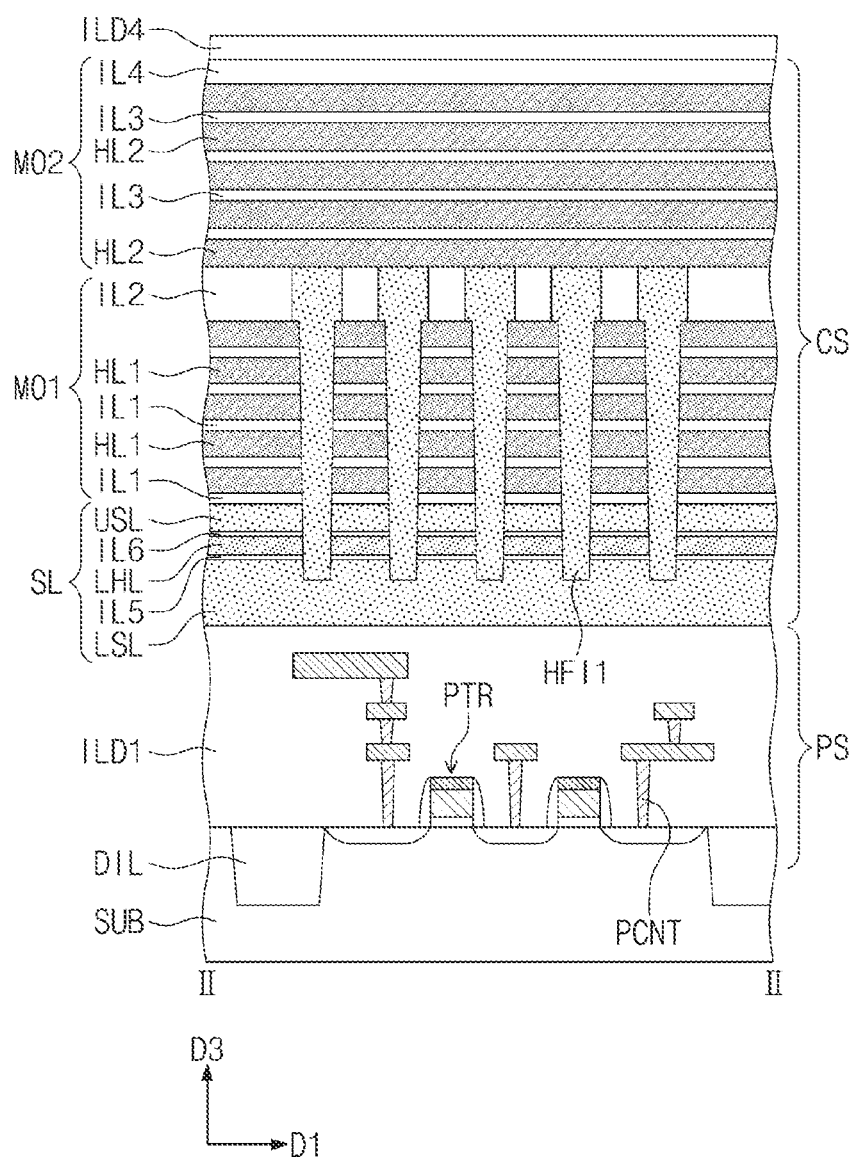

Referring to FIGS. 5, 14A, and 14B, a fourth interlayer dielectric layer ILD4 may be formed on an entire surface of the first substrate SUB. The formation of the fourth interlayer dielectric layer ILD4 on the key region SCL may include forming key patterns KEY. For example, the second protrusion PTP2 of the second dummy structure DST2 may cause that the key pattern KEY may be automatically formed while the fourth interlayer dielectric layer ILD4 is deposited on the second protrusion PTP2 of the second dummy structure DST2. The key pattern KEY may be protruding portion of the fourth interlayer dielectric layer ILD4 on the key region SCL. The key patterns KEY may vertically overlap corresponding second protrusions PTP2.

As a comparative example, when the fourth dielectric layer IL4 is not selectively removed from the key region SCL, it is unlikely that the key pattern KEY will be formed with the desired shape. This result arises because after the formation of the second mold structure MO2, various chemical mechanical polishing (CMP) processes and diverse patterning processes are performed which may it difficult for the second protrusion PTP2 of the fourth dielectric layer IL4 to remain intact. For example, to preserve the second protrusion PTP2 intact, a limitation may be imposed on the buffing CMP process discussed above.

In contrast, and consistent with embodiments of the inventive concept, it is possible to remove a damaged fourth dielectric layer IL4 from the key region SCL and to expose the topmost second sacrificial layer HL2 while keeping it intact. As the key pattern KEY is formed based on the second protrusion PTP2 of the exposed topmost second sacrificial layer HL2, the key pattern KEY may be achieved with the desired shape.

In some embodiments, the fourth interlayer dielectric layer ILD4 on the key region SCL may be thicker than the fourth dielectric layer IL4 on the cell array region CAR. For example, the fourth interlayer dielectric layer ILD4 on the cell array region CAR may have a fourth thickness TI4, and the fourth interlayer dielectric layer ILD4 on the key region SCL may have a fifth thickness TI5, wherein the fourth thickness TI4 is less than the fifth thickness TI5. Here, a difference between the fifth thickness TI5 and the fourth thickness TI4 may be less than twice the third thickness TI3 (i.e., TI5−TI4<2×TI3).

Figure 15A:
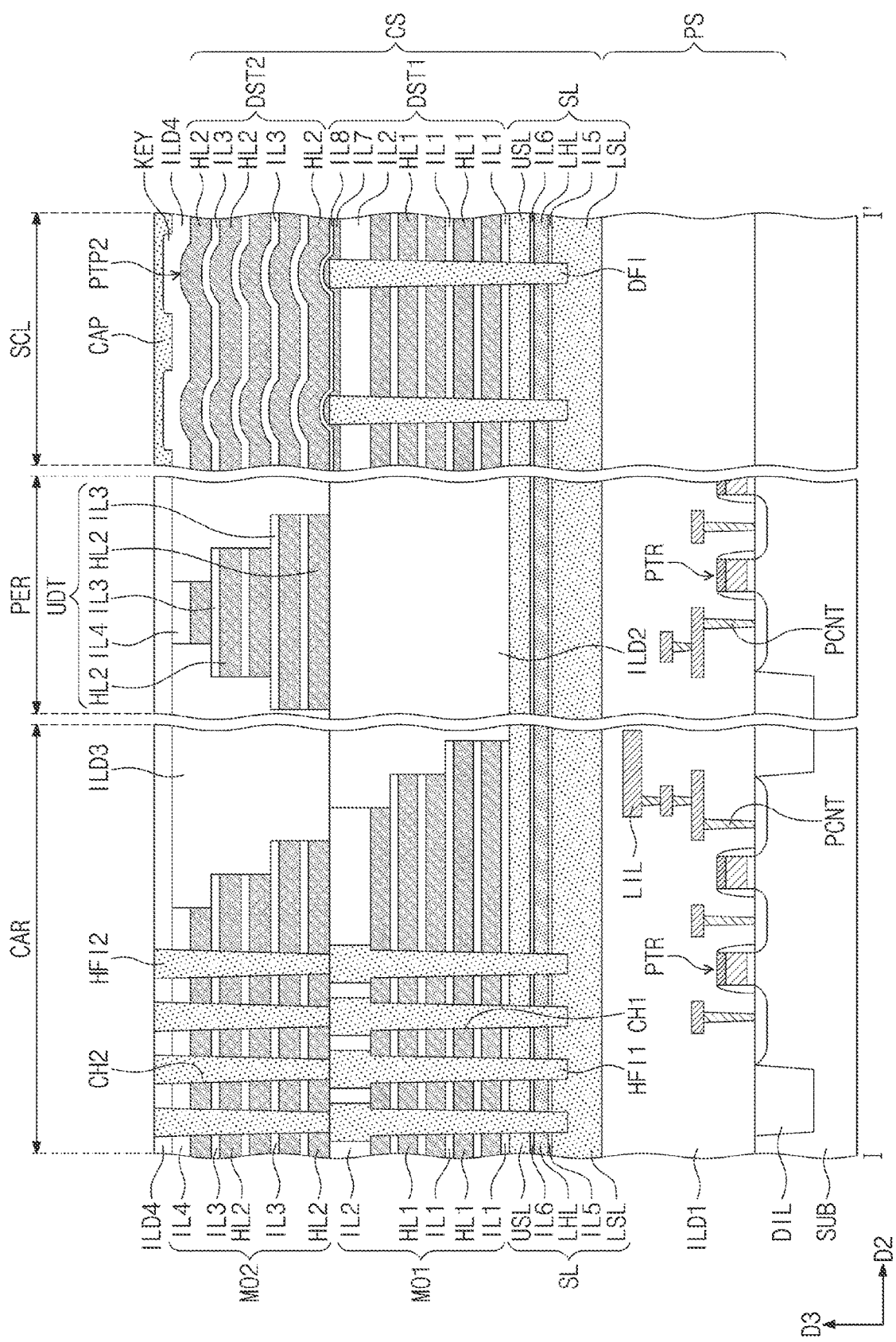
Figure 15B:
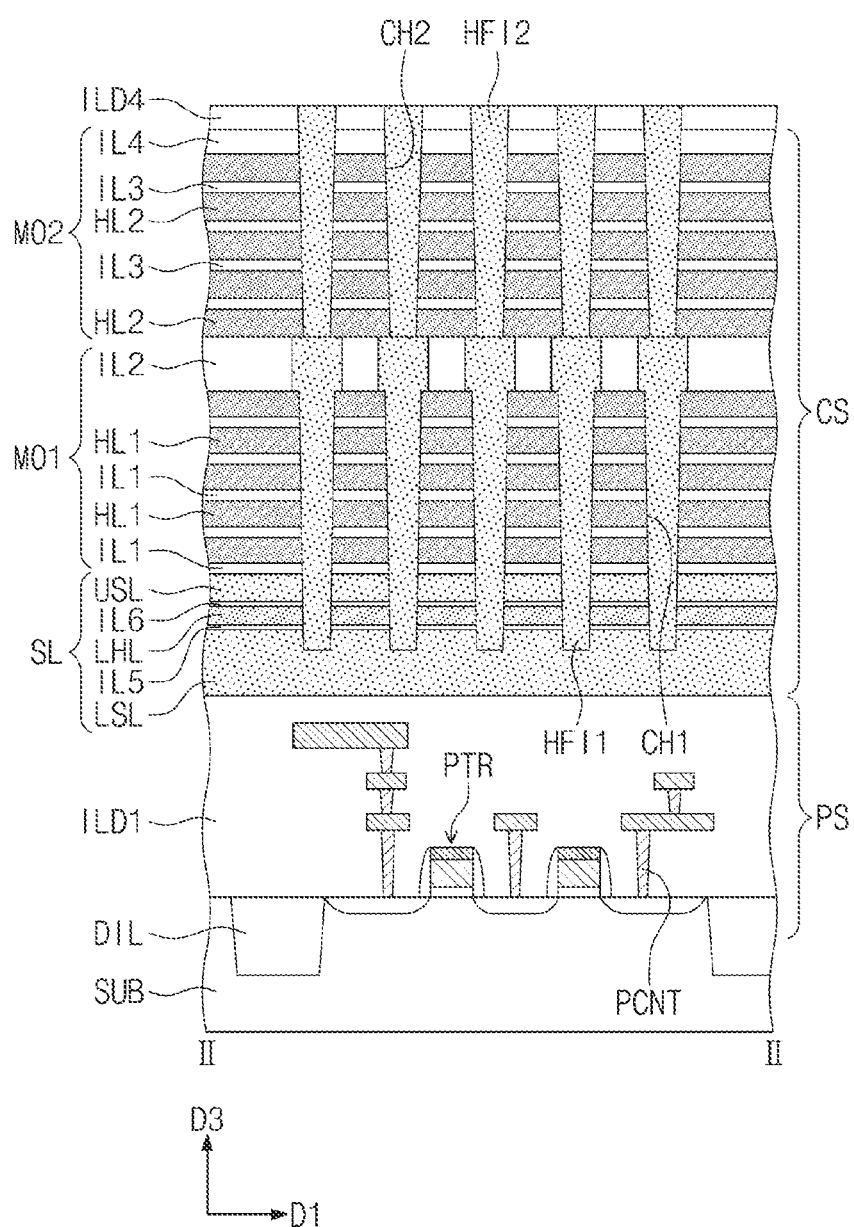

Referring to FIGS. 5, 15A, and 15B, second channel holes CH2 may be formed to penetrate the second mold structure MO2. The second channel holes CH2 may be formed to vertically overlap corresponding first sacrificial pillars HFI1.

A photolithography process may be used to form the second channel holes CH2. For example, the formation of the second channel holes CH2 may include using a photolithography process to form a photoresist pattern (and its underlying mask pattern) having openings that define positions on which the second channel holes CH2 will be formed, and then using the photoresist pattern as an etching mask to perform an anisotropic etching process. The key patterns KEY on the key region SCL may be used as alignment keys during the photolithography process for forming the second channel holes CH2. Here, the process of forming the second channel holes CH2 may be substantially the same as that used to form the first channel holes CH1, as described above.

According to embodiments of the inventive concept, the key pattern KEY may be formed in accordance with the second protrusion PTP2, as preserved intact, and thus the key pattern KEY may accurately and effectively serve as an alignment key. Therefore, the second channel holes CH2 may be formed in exact alignment with corresponding first channel holes CH1 with no offset between the first and second channel holes CH1 and CH2. As a result, embodiments of the inventive concept provide semiconductor memory devices having fewer process defects, and exhibiting increased reliability and better electrical performance.

Second sacrificial pillars HFI2 may be formed to fill corresponding second channel holes CH2. The second sacrificial pillars HFI2 may vertically overlap corresponding first sacrificial pillars HFI1. For example, the formation of the second sacrificial pillars HFI2 may include forming a second sacrificial mask layer to fill the second channel holes CH2, and then performing a planarization process on the second sacrificial mask layer until a top surface of the fourth interlayer dielectric layer ILD4 is exposed. For example, the second sacrificial mask layer may include polysilicon.

The second sacrificial mask layer may cover the key patterns KEY on the key region SCL. The fourth interlayer dielectric layer ILD4 on the key region SCL may have a top surface lower than that of the fourth interlayer dielectric layer ILD4 on the cell array region CAR, and thus the second sacrificial mask layer may remain on the key region SCL even after termination of the planarization process on the second sacrificial mask layer. The second sacrificial mask layer remaining on the key region SCL may constitute a capping layer CAP that covers the key patterns KEY. The capping layer CAP may have a top surface coplanar with that of the fourth interlayer dielectric layer ILD4 on the cell array region CAR.

Figure 16A:
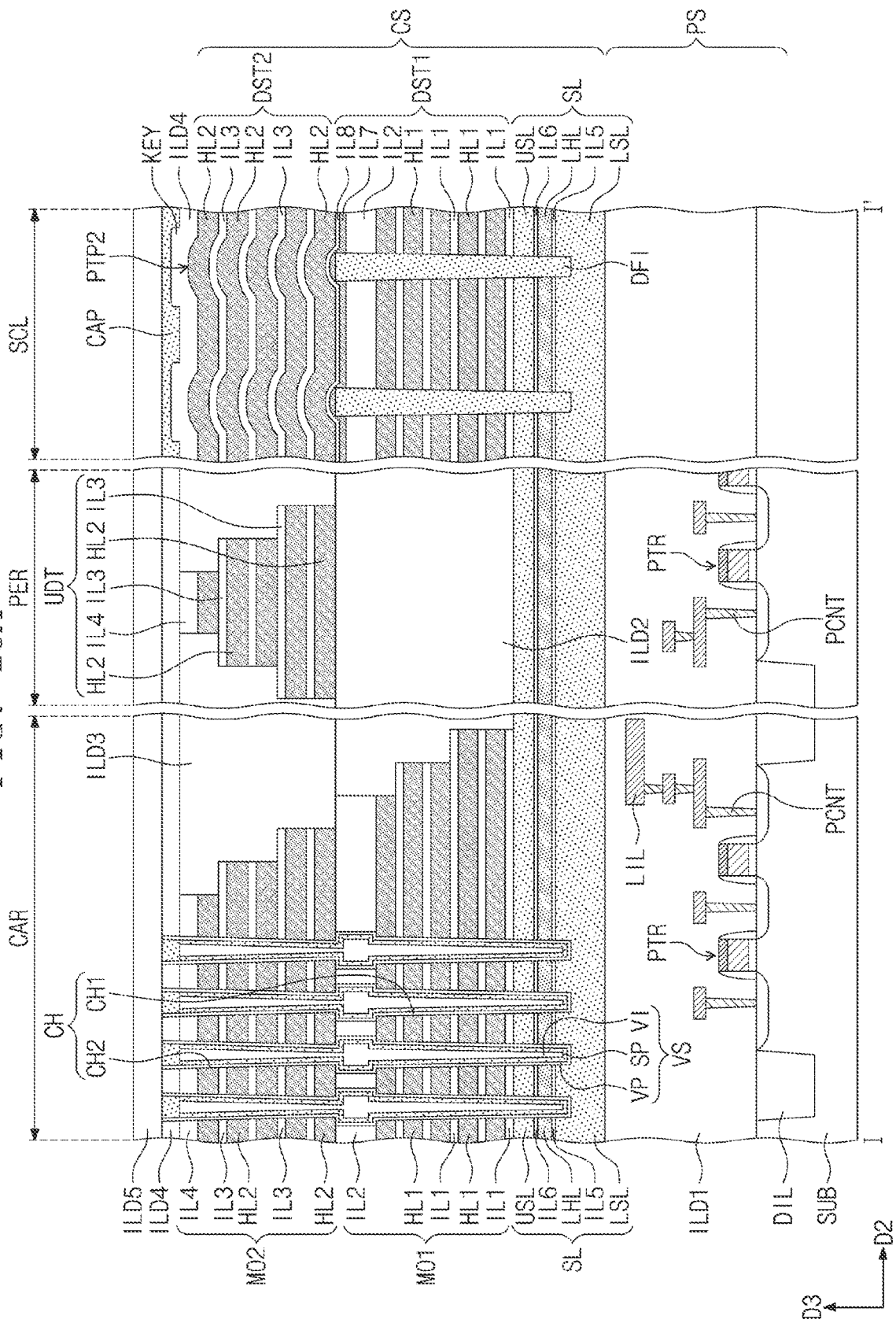
Figure 16B:
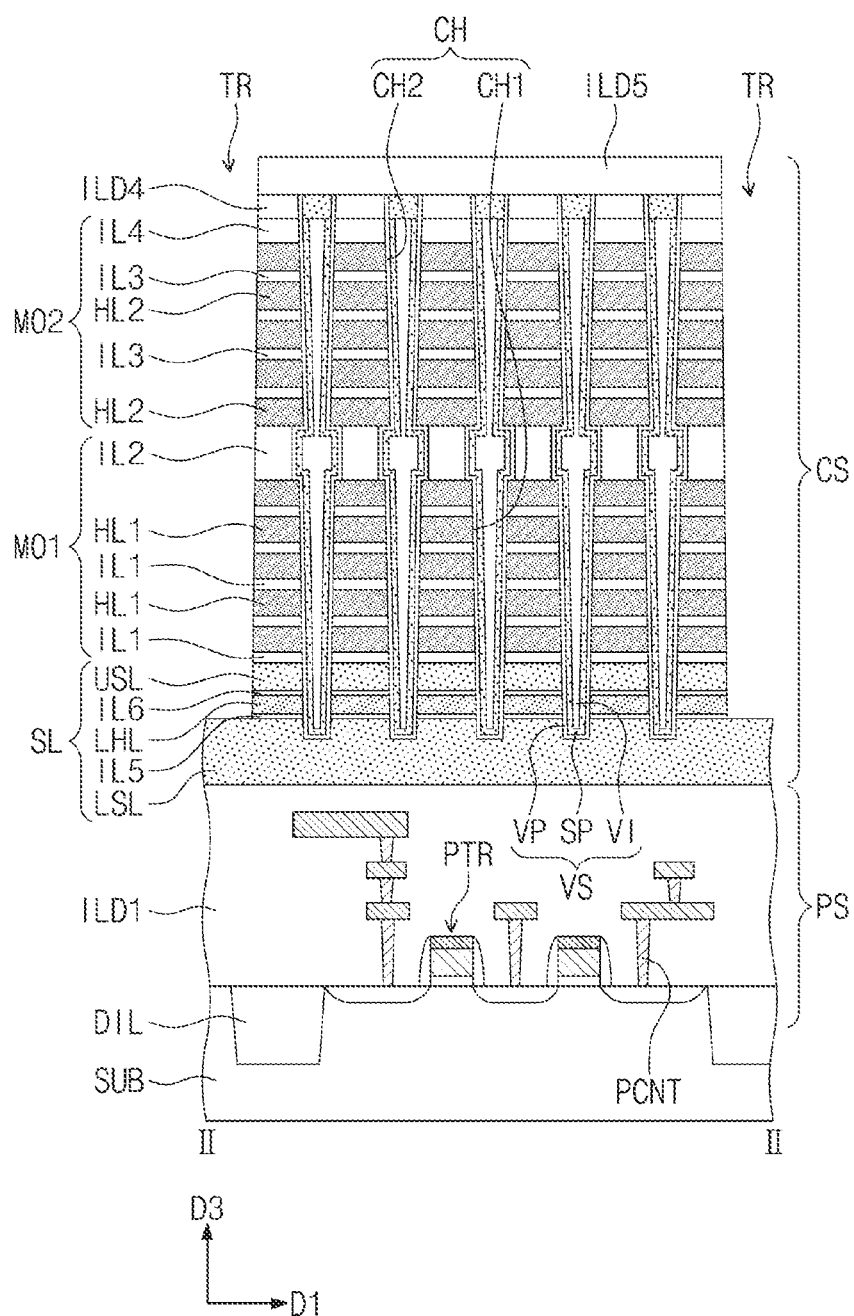

Referring to FIGS. 5, 16A, and 16B, the first and second sacrificial pillars HFI1 and HFI2 may be selectively and respectively removed from the first and second channel holes CH1 and CH2. One empty first channel hole CH1 and one empty second channel hole CH2 may be spatially connected to form a single channel hole CH.

Vertical channel structures VS may be formed in corresponding channel holes CH. The formation of the vertical channel structures VS may include sequentially forming a vertical dielectric pattern VP, a vertical semiconductor pattern SP, and a buried dielectric pattern VI on an inner wall of the channel hole CH. The vertical dielectric pattern VP and the vertical semiconductor pattern SP may be conformally formed. A conductive pad (PAD) may be formed on an upper portion of each of the vertical channel structures VS.

A fifth interlayer dielectric layer ILD5 may be formed on the fourth interlayer dielectric layer ILD4. On the cell array region CAR, the first and second mold structures MO1 and MO2 may be patterned to form trenches TR that penetrate therethrough (see FIG. 16B). The trench TR may expose the lower semiconductor layer LSL. The trench TR may expose sidewalls of the first and second sacrificial layers HL1 and HL2. The trench TR may expose a sidewall of the fifth dielectric layer IL5, a sidewall of the lower sacrificial layer LHL, and a sidewall of the sixth dielectric layer IL6.

Referring back to FIGS. 5, 6A, and 6B, a source semiconductor layer SSL may replace the lower sacrificial layer LHL that is exposed to the trenches TR on the cell array region CAR. For example, the lower sacrificial layer LHL exposed to the trenches TR may be selectively removed. The removal of the lower sacrificial layer LHL may expose a lower portion of the vertical dielectric pattern VP of each of the vertical channel structures VS.

The exposed lower portion of the vertical dielectric pattern VP may be selectively removed. Therefore, a lower portion of the vertical semiconductor pattern SP may be exposed. While the lower portion of the vertical dielectric pattern VP is removed, the fifth and sixth dielectric layers IL5 and IL6 may also be removed.

The source semiconductor layer SSL may be formed in a space provided by the removal of the fifth dielectric layer IL5, the lower sacrificial layer LHL, and the sixth dielectric layer IL6. The source semiconductor layer SSL may directly contact the exposed lower portion of the vertical semiconductor pattern SP. The source semiconductor layer SSL may directly contact the lower semiconductor layer LSL that underlies the source semiconductor layer SSL. The source semiconductor layer SSL may directly contact the upper semiconductor layer USL that overlies the source semiconductor layer SSL. A second substrate SL may include the lower semiconductor layer LSL, the source semiconductor layer SSL, and the upper semiconductor layer USL.

First and second electrodes EL1 and EL2 may replace the first and second sacrificial layers HL1 and HL2 exposed to the trenches TR on the cell array region CAR, which replacement may form a stack structure ST. For example, the first and second sacrificial layers HL1 and HL2 exposed to the trenches TR may be selectively removed. The first electrodes EL1 may be formed in spaces from which the first sacrificial layers HL1 are removed, and the second electrodes EL2 may be formed in spaces from which the second sacrificial layers HL2 are removed. Separation structures SPS may be correspondingly formed to fill the trenches TR.

Bit-line contact plugs BPLG may be formed to penetrate the fifth interlayer dielectric layer ILD5 to correspondingly connect the conductive pads PAD. Cell contact plugs CPLG may be formed to penetrate the second, third, third, fourth, and fifth interlayer dielectric layers ILD2, ILD3, ILD4, and ILD5 to correspondingly connect the first and second electrodes EL1 and EL2. On the fifth interlayer dielectric layer ILD5, bit lines BL may electrically connect the bit-line contact plugs BPLG, and upper wiring lines UIL may electrically connect the cell contact plugs CPLG.

According to embodiments of the inventive concept, a key pattern may be preserved intact on a key region, and thus an upper channel hole may be formed in exact alignment with a lower channel hole. Therefore, semiconductor devices consistent with embodiments of the inventive concept have fewer process defects and exhibit improved reliability and better electrical performance.

Although the inventive concept have been described in connection with certain embodiments illustrated in the accompanying drawings, it will be understood by those skilled in the art that various changes and modifications may be made without departing from the scope of the inventive concept as defined by the following claims.

What is claimed is:

1. A semiconductor device, comprising:
a substrate including a cell array region and a key region;
a stack structure on the cell array region, wherein the stack structure includes a first stack structure on the substrate and a second stack structure on the first stack structure, each of the first and second stack structures including a vertically stacked and spaced apart electrodes;
a dummy structure on the key region, wherein the dummy structure includes a first dummy structure on the substrate and a second dummy structure on the first dummy structure;
a vertical channel structure penetrating the stack structure to connect the substrate;
a dummy pillar penetrating the first dummy structure, wherein an upper portion of the dummy pillar protrudes upwardly from an upper surface of the first dummy structure, and the second dummy structure conforms to the first dummy structure such that an upper surface of the second dummy structure includes an upwardly extending protrusion aligned over the dummy pillar;
an interlayer dielectric layer on the stack structure and the dummy structure, wherein an upper portion of the interlayer dielectric layer on the dummy structure includes a key pattern that vertically overlaps the upwardly extending protrusion of the second dummy structure; and
a capping layer on the key region and covering the key pattern.

2. The semiconductor device of claim 1, wherein a top surface of the interlayer dielectric layer on the stack structure is higher than a top surface of the interlayer dielectric layer on the dummy structure.

3. The semiconductor device of claim 1, wherein a thickness of the interlayer dielectric layer on the stack structure is less than a thickness of the interlayer dielectric layer on the dummy structure.

4. The semiconductor device of claim 1, wherein the capping layer and the dummy pillar include a same material.

5. The semiconductor device of claim 1, wherein the capping layer includes a first material and the interlayer dielectric layer includes a second material different from the first material, and
a top surface of the capping layer and a top surface of the interlayer dielectric layer on the stacked structure are substantially coplanar.

6. The semiconductor device of claim 1, wherein the dummy pillar is one of a plurality of dummy pillars penetrating the first dummy structure,
the plurality of dummy pillars includes respective upper portions protruding upwardly from the upper surface of the first dummy structure,
the second dummy structure includes a plurality of upwardly extending protrusions aligned over the respective plurality of dummy pillars, and
the key pattern vertically overlaps the upwardly extending protrusions of the second dummy structure.

7. The semiconductor device of claim 1, wherein the key region is a scribe lane area.

8. The semiconductor device of claim 1, further comprising:
a peripheral circuit structure below the substrate, wherein the peripheral circuit structure includes at least one peripheral circuit.

9. The semiconductor device of claim 1, wherein the vertical channel structure includes:
a vertical semiconductor pattern; and
a vertical dielectric pattern between the vertical semiconductor pattern and the electrodes, wherein the vertical dielectric pattern includes a charge storage layer.

10. The semiconductor device of claim 1, further comprising:
an upper dummy structure on a peripheral region of the substrate, wherein the peripheral region is disposed between the cell array region and the key region, and the upper dummy structure is at a same level as the second stack structure and the second dummy structure.

11. The semiconductor device of claim 1, wherein the capping layer does not cover the stack structure.

12. An electronic system, comprising:
a semiconductor device including an input/output pad electrically connected to a peripheral circuit; and
a controller electrically connected through the input/output pad to the semiconductor device and configured to control the semiconductor device,
wherein the semiconductor device includes:
a substrate including a cell array region and a key region;
a stack structure on the cell array region, the stack structure including vertically stacked and spaced apart electrodes;
a dummy structure on the key region, wherein an upper surface of the dummy structure includes a plurality of upwardly extending protrusions;
a vertical channel structure penetrating the stack structure to connect the substrate;
an interlayer dielectric layer on the stack structure and the dummy structure, wherein the interlayer dielectric layer on the upper surface of the dummy structure conforms with the upper surface of the dummy structure and includes a key pattern vertically overlapping the plurality of upwardly extending protrusions of the dummy structure, and a top surface of the interlayer dielectric layer on the stack structure is higher than a top surface of the interlayer dielectric layer on the dummy structure; and
a capping layer on the key region and covering the key pattern, wherein the capping layer includes polysilicon.

13. The electronic system of claim 12, wherein a top surface of the capping layer and the top surface of the interlayer dielectric layer on the stack structure are substantially coplanar.

14. The electronic system of claim 12, wherein the semiconductor device further includes a peripheral circuit structure below the substrate, wherein the peripheral circuit structure includes at least one peripheral circuit.

15. The electronic system of claim 12, wherein the dummy structure includes a first dummy structure on the substrate and a second dummy structure on the first dummy structure,
an upper surface of the second dummy structure includes the plurality of upwardly extending protrusions;
the semiconductor device further includes a plurality of dummy pillars penetrating the first dummy structure, and
the plurality of upwardly extending protrusions are aligned over the dummy pillars, respectively.

16. The electronic system of claim 15, wherein an upper portion of the dummy pillars protrude upward from an upper surface of the first dummy structure, and the second dummy structure conforms to the first dummy structure such that the plurality of upwardly extending protrusions are aligned over the dummy pillars.

17. The semiconductor device of claim 12, wherein the capping layer does not cover the stack structure.

18. A semiconductor device, comprising:
a substrate including a cell array region and a key region;
a stack structure on the cell array region, wherein the stack structure includes a first stack structure on the substrate and a second stack structure on the first stack structure, each of the first and second stack structures including a vertically stacked and spaced apart electrodes;
a dummy structure on the key region, wherein the dummy structure includes a first dummy structure on the substrate and a second dummy structure on the first dummy structure;
a vertical channel structure penetrating the stack structure to connect the substrate;
a dummy pillar penetrating the first dummy structure;
an interlayer dielectric layer on the stack structure and the dummy structure, wherein an upper portion of the interlayer dielectric layer on the dummy structure includes a key pattern that vertically overlaps the dummy pillar;
a capping layer on the key region and covering the key pattern; and
an upper dummy structure on a peripheral region of the substrate, wherein the peripheral region is disposed between the cell array region and the key region, and the upper dummy structure is at a same level as the second stack structure and the second dummy structure.

19. The semiconductor device of claim 18, wherein a top surface of the interlayer dielectric layer on the stack structure is higher than a top surface of the interlayer dielectric layer on the dummy structure.

20. The semiconductor device of claim 18, wherein the capping layer does not cover the stack structure.

\* \* \* \* \*